(12) United States Patent
Omori et al.

(10) Patent No.: US 11,164,842 B2
(45) Date of Patent: *Nov. 2, 2021

(54) BONDING APPARATUS AND BONDING SYSTEM

(71) Applicant: Tokyo Electron Limited, Tokyo (JP)

(72) Inventors: Yosuke Omori, Koshi (JP); Kenji Sugakawa, Koshi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 138 days.

This patent is subject to a terminal disclaimer.

(21) Appl. No.: 16/556,409

(22) Filed: Aug. 30, 2019

(65) Prior Publication Data

US 2019/0385971 A1 Dec. 19, 2019

Related U.S. Application Data

(63) Continuation of application No. 15/670,072, filed on Aug. 7, 2017, now Pat. No. 10,438,918.

(30) Foreign Application Priority Data

Aug. 9, 2016 (JP) .................................. 2016-156083

(51) Int. Cl.
| | |
|---|---|
| *B32B 37/00* | (2006.01) |
| *H01L 23/00* | (2006.01) |
| *H01L 21/20* | (2006.01) |
| *H01L 21/64* | (2006.01) |
| *H01L 21/67* | (2006.01) |

(52) U.S. Cl.
CPC ........ *H01L 24/743* (2013.01); *H01L 21/2007* (2013.01); *H01L 21/64* (2013.01); *H01L 21/67092* (2013.01)

(58) Field of Classification Search
USPC ......................................................... 156/580
See application file for complete search history.

(56) References Cited

U.S. PATENT DOCUMENTS

| | | | |
|---|---|---|---|
| 6,620,285 B2 | 9/2003 | Tomita | |
| 10,438,918 B2 * | 10/2019 | Omori | ..................... H01L 21/64 |

FOREIGN PATENT DOCUMENTS

| | | |
|---|---|---|
| JP | 2012-186244 A | 9/2012 |
| JP | 2013-191789 A | 9/2013 |
| JP | 2015-095579 A | 5/2015 |

\* cited by examiner

*Primary Examiner* — James D Sells
(74) *Attorney, Agent, or Firm* — Pearne & Gordon LLP

(57) ABSTRACT

Deformation of substrates after the substrates are bonded can be suppressed. A bonding apparatus includes a first holding unit configured to attract and hold a first substrate from above; a second holding unit provided under the first holding unit and configured to attract and hold a second substrate from below; and a striker configured to press a central portion of the first substrate from above and bring the first substrate into contact with the second substrate. The first holding unit is configured to attract and hold a partial region of a peripheral portion of the first substrate, and the first holding unit attracts and holds the region which intersects with a direction, among directions from the central portion of the first substrate toward the peripheral portion thereof, in which a bonding region between the first substrate and the second substrate is expanded faster.

9 Claims, 14 Drawing Sheets

BONDING APPARATUS AND BONDING SYSTEM

CROSS-REFERENCE TO RELATED APPLICATION

This is a continuation application of U.S. patent application Ser. No. 15/670,072, filed on Aug. 7, 2017, which claims the benefit of Japanese Patent Application No. 2016-156083 filed on Aug. 9, 2016, the entire disclosures of which are incorporated herein by reference.

TECHNICAL FIELD

The embodiments described herein pertain generally to a bonding apparatus and a bonding system.

BACKGROUND

Conventionally, there is known a bonding apparatus configured to bond substrates such as semiconductor wafers by an intermolecular force.

In this kind of bonding apparatus, by pushing down a central portion of an upper substrate with a striker while holding an entire peripheral portion of the upper substrate, the central portion of the upper substrate is brought into contact with a central portion of a lower substrate. Accordingly, the central portions of the upper substrate and the lower substrate are bonded by an intermolecular force, and a bonding region is formed. Then, a so-called bonding wave is generated, whereby the bonding region is expanded toward the peripheral portion of the substrate. Accordingly, the upper substrate and the lower substrate are bonded on their entire surfaces (See, for example, Patent Document 1).

To suppress a deformation of the substrates after they are bonded, it is desirable that the bonding wave is expanded from the central portions of the substrates toward the peripheral portions thereof uniformly, that is, in a concentric shape.

Patent Document 1: Japanese Patent Laid-open Publication No. 2015-095579

The bonding wave, however, is not actually expanded in the concentric shape but in a non-uniform manner. This is deemed to be because there is anisotropy in a physical property of a substrate, such as Young's modulus or Poisson's ratio, and a velocity of the bonding wave in a certain crystal direction gets faster or slower than a velocity of the bonding wave in the other crystal direction by being affected by such anisotropy.

Furthermore, it is also deemed to be because, though the bonding wave is expanded in the concentric shape, a deformation amount of the substrate caused by a stress applied thereto is different depending on directions due to the anisotropy of Poisson's ratio or Young's modulus of the substrate.

SUMMARY

In view of the foregoing, exemplary embodiments provide a bonding apparatus and a bonding system capable of suppressing deformation of substrates after the substrates are bonded.

In an exemplary embodiment, a bonding apparatus includes a first holding unit, a second holding unit and a striker. The first holding unit is configured to attract and hold a first substrate from above. The second holding unit is provided under the first holding unit and configured to attract and hold a second substrate from below. The striker is configured to press a central portion of the first substrate from above and bring the first substrate into contact with the second substrate. The first holding unit is configured to attract and hold a partial region of a peripheral portion of the first substrate, and the first holding unit attracts and holds the region which intersects with a direction, among directions from the central portion of the first substrate toward the peripheral portion thereof, in which a bonding region between the first substrate and the second substrate is expanded faster.

According to the exemplary embodiment, it is possible to suppress the deformation of the substrates after the substrates are bonded.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
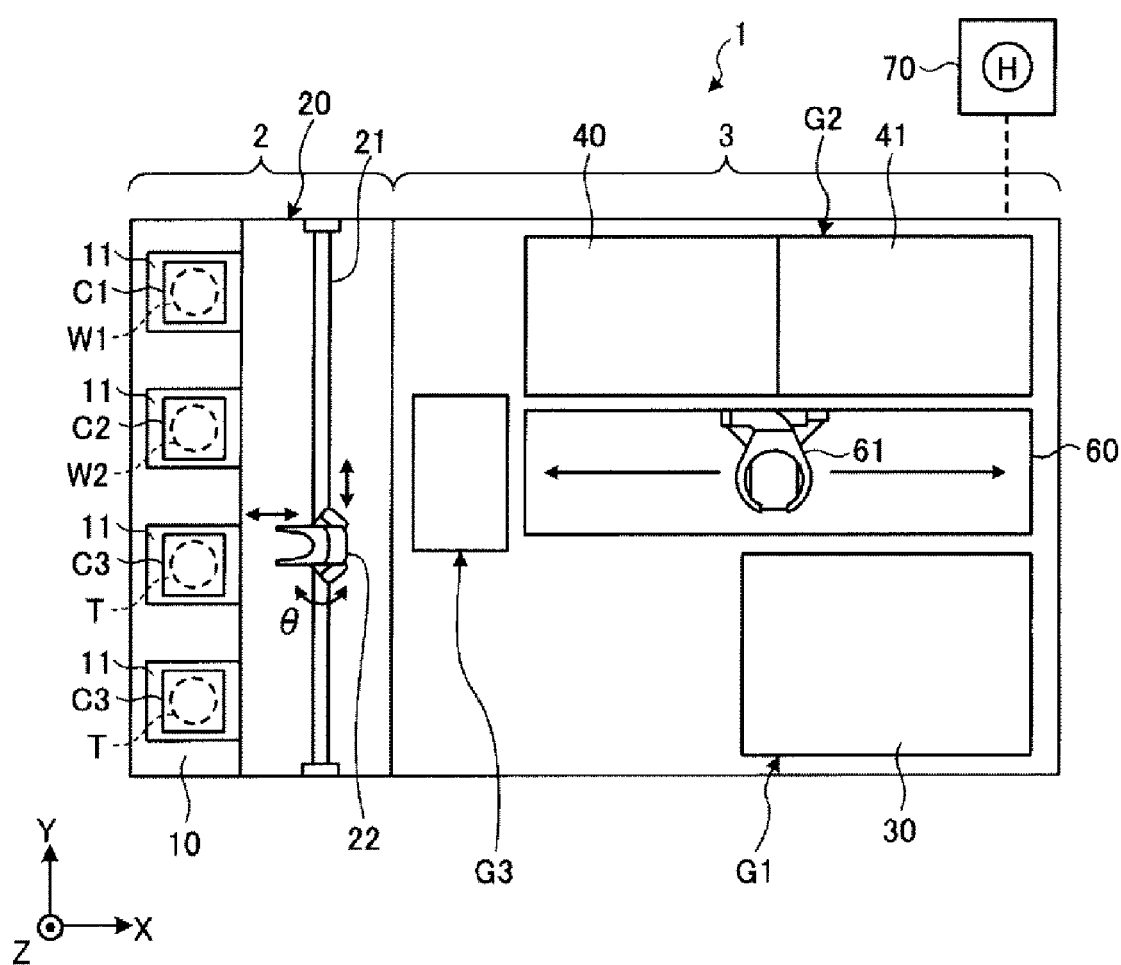
FIG. 1 is a schematic plan view illustrating a configuration of a bonding system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, an exemplary embodiment of the present disclosure will be explained in detail with reference to the accompanying drawings.

Hereinafter, a bonding apparatus and a bonding system according to the present disclosure will be explained in detail with reference to the accompanying drawings. Further, it should be noted that the exemplary embodiments are not intended to be anyway limiting.

1. Configuration of Bonding System

Figure 2:
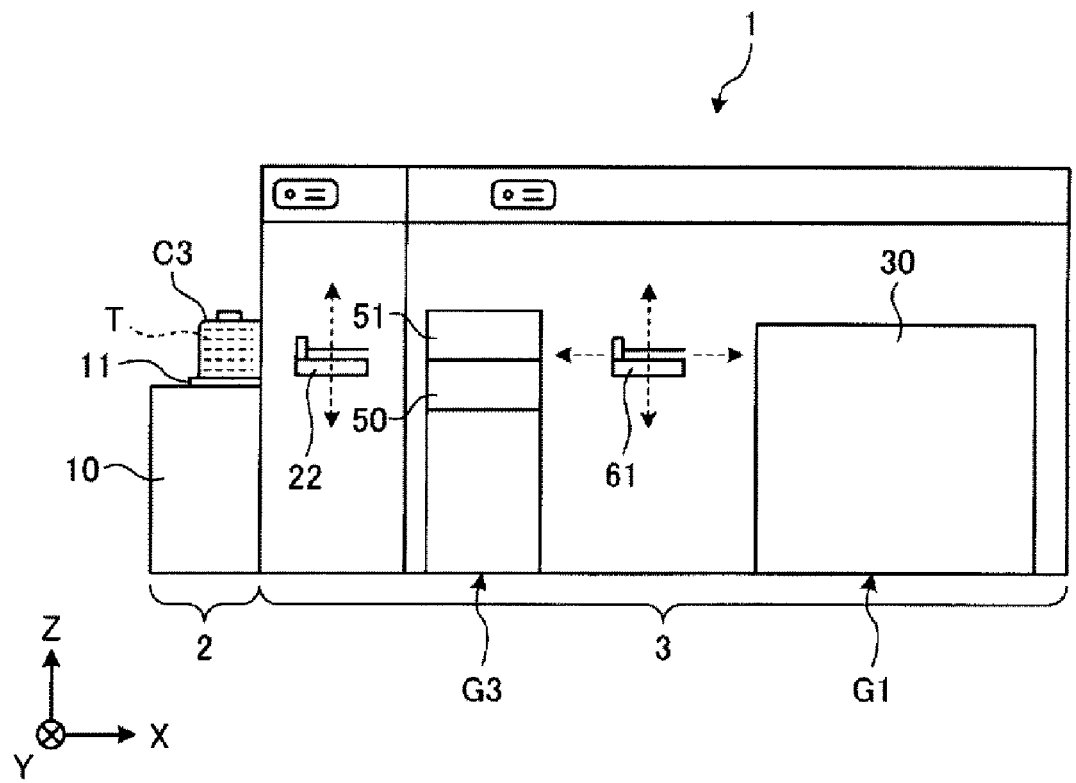
FIG. 2 is a schematic side view illustrating the configuration of the bonding system according to the exemplary embodiment.
Figure 3:
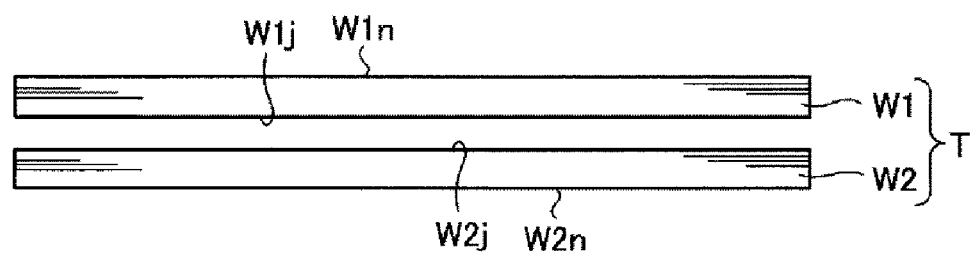
FIG. 3 is a schematic side view of a first substrate and a second substrate.

First, a configuration of a bonding system according to an exemplary embodiment will be explained with reference to FIG. 1 to FIG. 3. FIG. 1 is a schematic plan view illustrating a configuration of the bonding system according to the exemplary embodiment. FIG. 2 is a schematic side view illustrating the configuration of the bonding system according to the exemplary embodiment. FIG. 3 is a schematic side view illustrating a first substrate and a second substrate.

In the following description, for the purposes of clear understanding, there may be used a rectangular coordinate system in which the X-axis direction, Y-axis direction and Z-axis direction which are orthogonal to each other are defined, and the positive Z-axis direction is regarded as a vertically upward direction. Furthermore, in the respective drawings including FIG. 1 and FIG. 2, only the component parts relevant to the explanation are illustrated, and illustration of general component parts may be omitted.

A bonding system 1 according to the exemplary embodiment shown in FIG. 1 is configured to form a combined substrate T by joining a first substrate W1 and a second substrate W2 to each other (see FIG. 3).

The first substrate W1 is, for example, a semiconductor substrate such as a silicon wafer or a compound semiconductor wafer on which a multiple number of electronic circuits are formed. The second substrate W2 is, for example, a bare wafer on which no electronic circuit is formed. The first substrate W1 and the second substrate W2 have the substantially same diameter. Further, an electronic circuit may be formed on the second substrate W2.

In the description that follows, the first substrate W1 may sometimes be referred to as "upper wafer W1"; the second substrate W2, "lower wafer W2"; and the combined substrate T, "combined wafer T." Further, in the following description, as depicted in FIG. 3, among surfaces of the upper wafer W1, a surface to be bonded to the lower wafer W2 will be referred to as "bonding surface W1$j$," and a surface opposite to the bonding surface W1$j$ will be referred to as "non-bonding surface W1$n$." Further, among surfaces of the lower wafer W2, a surface to be bonded to the upper wafer W1 will be referred to as "bonding surface W2$j$," and a surface opposite to the bonding surface W2$j$ will be referred to as "non-bonding surface W2$n$."

As shown in FIG. 1, the bonding system 1 includes a carry-in/out station 2 and a processing station 3. The carry-in/out station 2 and the processing station 3 are arranged in this sequence along the positive X-axis direction. Further, the carry-in/out station 2 and the processing station 3 are connected as a single body.

The carry-in/out station 2 includes a placing table 10 and a transfer section 20. The placing table 10 is equipped with a multiple number of placing plates 11. Provided on the placing plates 11 are cassettes C1, C2 and C3 each of which accommodates therein a plurality of (e.g., 25 sheets of) substrates horizontally. For example, the cassette C1 accommodates therein the upper wafers W1; the cassette C2, the lower wafers W2; and the cassettes C3, the combined wafers T.

The transfer section 20 is provided adjacent to the positive X-axis side of the placing table 10. Provided in the transfer section 20 are a transfer path 21 extended in the Y-axis direction and a transfer device 22 configured to be movable along the transfer path 21. The transfer device 22 is configured to be movable in the X-axis direction as well as in the Y-axis direction and pivotable around the Z-axis. Further, the transfer device 22 is also configured to transfer the upper wafers W1, the lower wafers W2 and the combined wafers T between the cassettes C1 to C3 placed on the placing plates 11 and a third processing block G3 of the processing station 3 to be described later.

Further, the number of the cassettes C1 to C3 placed on the placing plates 11 is not limited to the shown example. In addition, besides the cassettes C1 to C3, a cassette or the like for collecting a problematic substrate may be additionally provided on the placing plates 11.

A multiple number of, for example, three processing blocks G1, G2 and G3 equipped with various kinds of devices are provided in the processing station 3. For example, the first processing block G1 is provided at a front side (negative Y-axis side of FIG. 1) of the processing station 3, and the second processing block G2 is provided at a rear side (positive Y-axis side of FIG. 1) of the processing station 3. Further, the third processing block G3 is provided at a side of the carry-in/out station 2 (negative X-axis side of FIG. 1) of the processing station 3.

Provided in the first processing block G1 is a surface modifying apparatus 30 configured to modify the bonding surface W1$j$ of the upper wafer W1 and the bonding surface W2$j$ of the lower wafer W2. In the surface modifying apparatus 30, the $SiO_2$ bond on the bonding surfaces W1$j$ and W2$j$ of the upper wafer W1 and the lower wafer W2 is cut to be turned into SiO of a single bond, so that the bonding surfaces W1$j$ and W2$j$ are modified such that these surfaces are easily hydrophilized afterwards.

Furthermore, in the surface modifying apparatus 30, for example, an oxygen gas or a nitrogen gas as a processing gas is excited into plasma under a decompressed atmosphere to be ionized. As these oxygen ions or nitrogen ions are irradiated to the bonding surfaces W1j and W2j of the upper wafer W1 and the lower wafer W2, the bonding surfaces W1j and W2j are plasma-processed to be modified.

In the second processing block G2, a surface hydrophilizing apparatus 40 and a bonding apparatus 41 are disposed. The surface hydrophilizing apparatus 40 is configured to hydrophilize the bonding surfaces W1j and W2j of the upper wafer W1 and the lower wafer W2 with, for example, pure water, and then, clean the bonding surfaces W1j and W2j. In the surface hydrophilizing apparatus 40, while rotating the upper wafer W1 or the lower wafer W2 held by, for example, a spin chuck, the pure water is supplied onto the upper wafer W1 or the lower wafer W2. Accordingly, the pure water supplied onto the upper wafer W1 or the lower wafer W2 is diffused onto the bonding surfaces W1j and W2j of the upper wafer W1 or the lower wafer W2, so that the bonding surfaces W1j and W2j are hydrophilized.

The bonding apparatus 41 is configured to bond the upper wafer W1 and the lower wafer W2, which are hydrophilized, by an intermolecular force. A configuration of the bonding apparatus 41 will be discussed later.

In the third processing block G3, as shown in FIG. 2, transition (TRS) devices 50 and 51 for the upper wafer W1, the lower wafer W2 and the combined wafer T are provided in two levels in this order from below.

Further, as illustrated in FIG. 1, a transfer section 60 is formed in a region surrounded by the first processing block G1, the second processing block G2 and the third processing block G3. A transfer device 61 is provided in the transfer section 60. The transfer device 61 is equipped with, for example, a transfer arm which is configured to be movable in a vertical direction and a horizontal direction and pivotable around a vertical axis. The transfer device 61 is moved within the transfer section 60 and transfers the upper wafers W1, the lower wafers W2 and the combined wafers T with respect to preset devices within the first processing block G1, the second processing block G2 and the third processing block G3 which are adjacent to the transfer section 60.

Furthermore, as depicted in FIG. 1, the bonding system 1 includes a control device 70. The control device 70 controls an operation of the bonding system 1. The control device 70 may be implemented by, for example, a computer and includes a non-illustrated controller and a non-illustrated storage unit. The controller includes a microcomputer having a CPU (Central Processing Unit), a ROM (Read Only Memory), a RAM (Random Access Memory), an input/output port, or the like, or various kinds of circuits. The CPU of the microcomputer implements a control operation to be described later by reading and executing a program stored in the ROM. The storage unit may be implemented by, but not limited to, a semiconductor memory device such a RAM or a flash memory, or a storage device such as a hard disc, an optical disc, or the like.

Further, the program may be recorded in a computer-readable recording medium and installed from the recording medium to the storage unit of the control device 70. The computer-readable recording medium may be, by way of non-limiting example, a hard disc (HD), a flexible disc (FD), a compact disc (CD), a magnet optical disc (MO), or a memory card.

2. Configuration of Bonding Apparatus

Figure 4:
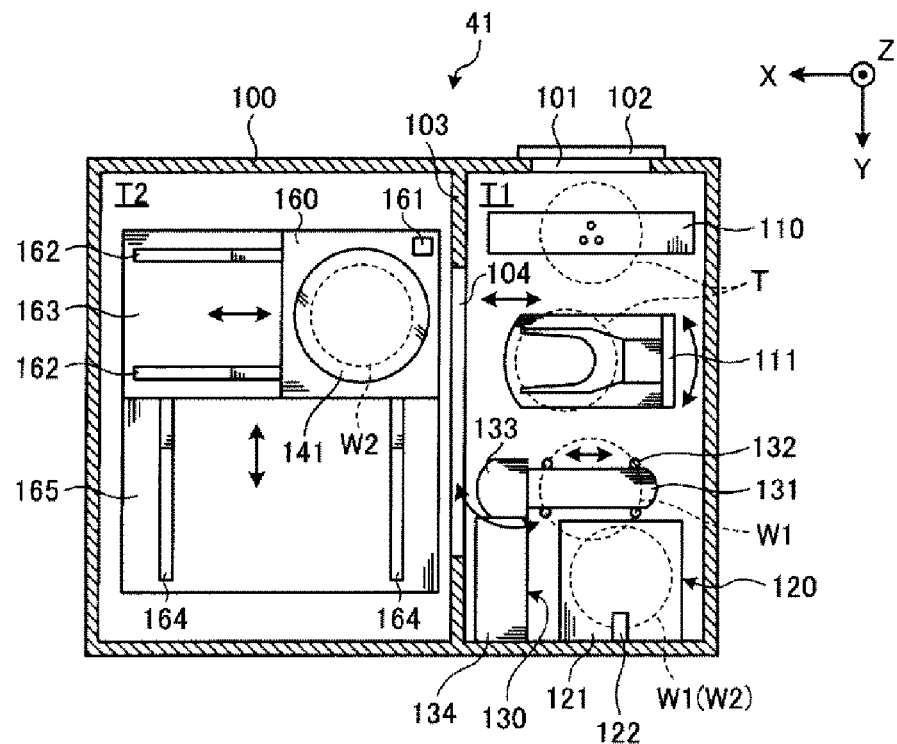
FIG. 4 is a schematic plane view illustrating a configuration of a bonding apparatus.
Figure 5:
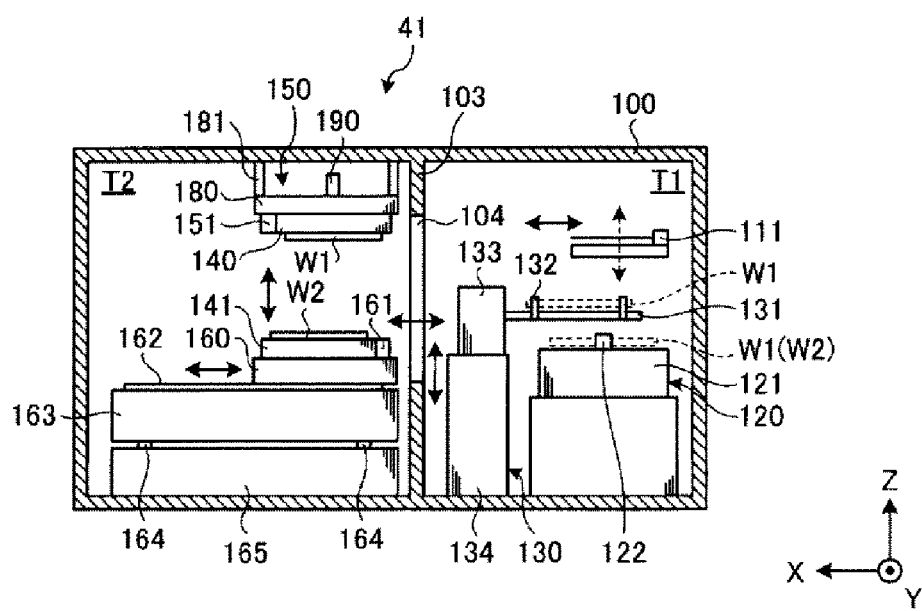
FIG. 5 is a schematic side view illustrating a configuration of the bonding apparatus.

Now, a configuration of the bonding apparatus 41 will be explained with reference to FIG. 4 and FIG. 5. FIG. 4 is a schematic plan view illustrating a configuration of the bonding apparatus 41. FIG. 5 is a schematic side view illustrating the configuration of the bonding apparatus 41.

As depicted in FIG. 4, the bonding apparatus 41 includes a processing vessel 100 having a hermetically sealable inside. A carry-in/out opening 101 for the upper wafer W1, the lower wafer W2 and the combined wafer T is formed on a lateral side of the processing vessel 100 at a side of the transfer region 60. A shutter 102 for opening/closing the carry-in/out opening 101 is provided at the carry-in/out opening 101.

The inside of the processing vessel 100 is partitioned into a transfer region T1 and a processing region T2 by an inner wall 103. The aforementioned carry-in/out opening 101 is formed on the lateral side of the processing vessel 100 in the transfer region T1. Further, the inner wall 103 is also provided with a carry-in/out opening 104 for the upper wafer W1, the lower wafer W2 and the combined wafer T.

A transition 110, a wafer transfer mechanism 111, an inverting mechanism 130 and a position adjusting mechanism 120 are arranged in the transfer region T1 in this order from the carry-in/out opening 101, for example.

The transition 110 is configured to temporarily place thereon the upper wafer W1, the lower wafer W2 and the combined wafer T. The transition 110 has two levels, for example, and is capable of holding any two of the upper wafer W1, the lower wafer W2 and the combined wafer T.

The wafer transfer mechanism 111 is equipped with a transfer arm configured to be movable in the vertical direction (Z-axis direction) and the horizontal directions (Y-axis direction and X-axis direction) and also pivotable around a vertical axis, as shown in FIG. 4 and FIG. 5. The wafer transfer mechanism 111 is capable of transferring the upper wafer W1, the lower wafer W2 and the combined wafer T within the transfer region T1 or between the transfer region T1 and the processing region T2.

The position adjusting mechanism 120 is configured to adjust a direction of the upper wafer T1 (lower wafer W2) in the horizontal direction. To elaborate, the position adjusting mechanism 120 includes a base 121 equipped with a non-illustrated holding unit configured to hold and rotate the upper wafer W1 (lower wafer W2); and a detector 122 configured to detect a position of a notch of the upper wafer W1 (lower wafer W2). The position adjusting mechanism 120 adjusts the position of the notch of the upper wafer W1 (lower wafer W2) by detecting the position of the notch with the detector 122 while rotating the upper wafer W1 (lower wafer W2) held by the base 121. Accordingly, the position of the upper wafer W1 (lower wafer W2) in the horizontal direction is adjusted.

The inverting mechanism 130 is configured to invert a front surface and a rear surface of the upper wafer W1. To elaborate, the inverting mechanism 130 is equipped with a holding arm 131 configured to hold the upper wafer W1. The holding arm 131 is extended in the horizontal direction (X-axis direction). Further, the holding arm 131 is provided with, for example, holding members 132 configured to hold the upper wafer W1 at four positions.

The holding arm 131 is supported by a driving unit 133 including, for example, a motor or the like. The holding arm 131 is configured to be rotatable around the horizontal axis by the driving unit 133. Further, the holding arm 131 is rotatable around the driving unit 133 and movable in the horizontal direction (X-axis direction). Another driving unit (not shown) including, for example, a motor or the like is provided under the driving unit 133. The driving unit 133 can be moved in the vertical direction along a vertically extended supporting column 134 by this another driving unit.

Further, the upper wafer W1 held by the holding members 132 can be rotated around the horizontal axis through the driving unit 133 and can also be moved in the vertical direction and the horizontal direction. Further, the upper wafer W1 held by the holding members 132 can be moved between the position adjusting mechanism 120 and an upper chuck 140 to be described later by being rotated around the driving unit 133.

Provided in the processing region T2 are the upper chuck 140 configured to hold and attract a top surface (non-bonding surface W1n) of the upper wafer W1 from above; and a lower chuck 141 configured to place the lower wafer W2 thereon and hold and attract a bottom surface (non-bonding surface W2n) of the lower wafer W2 from below. The lower chuck 141 is disposed under the upper chuck 140 to face the upper chuck 140.

As depicted in FIG. 5, the upper chuck 140 is held by an upper chuck holder 150 provided above the upper chuck 140. The upper chuck holder 150 is provided at a ceiling surface of the processing vessel 100. The upper chuck 140 is fixed to the processing vessel 100 with the upper chuck holder 150 therebetween.

The upper chuck holder 150 is equipped with an upper imaging unit 151 configured to image the top surface (bonding surface W2j) of the lower wafer W2 held by the lower chuck 141. By way of non-limiting example, the upper imaging unit 151 is implemented by a CCD camera.

The lower chuck 141 is supported by a first lower chuck moving unit 160 which is provided under the corresponding lower chuck 141. The first lower chuck moving unit 160 is configured to move the lower chuck 141 in the horizontal direction (X-axis direction), as will be described later. Further, the first lower chuck moving unit 160 is also configured to move the lower chuck 141 in the vertical direction and rotate the lower chuck 141 around the vertical axis.

The first lower chuck moving unit 160 is equipped with a lower imaging unit 161 configured to image the bottom surface (bonding surface W1j) of the upper wafer W1 held by the upper chuck 140 (See FIG. 5). The lower imaging unit 161 is implemented by, by way of example, a CCD camera.

The first lower chuck moving unit 160 is mounted to a pair of rails 162 which is provided at a bottom surface side of the first lower chuck moving unit 160 and extended in the horizontal direction (X-axis direction). The first lower chuck moving unit 160 is configured to be moved along the rails 162.

The pair of rails 162 is provided on a second lower chuck moving unit 163. The second lower chuck moving unit 163 is mounted on a pair of rails 164 which is provided at a bottom surface side of the second lower chuck moving unit 163 and extended in the horizontal direction (Y-axis direction). This second lower chuck moving unit 163 is configured to be moved in the horizontal direction (Y-axis direction) along the rails 164. Further, the pair of rails 164 is provided on a placing table 165 provided on the bottom surface of the processing vessel 100.

Figure 6:
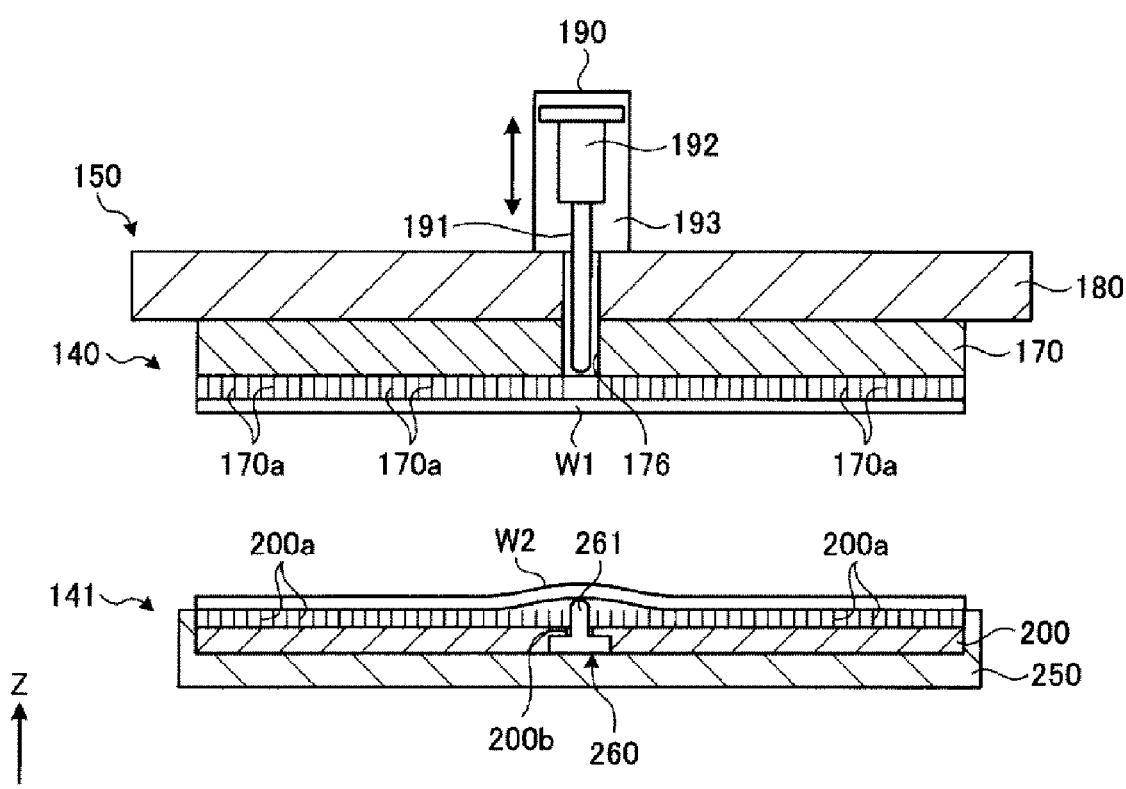
FIG. 6 is a schematic side sectional view illustrating configurations of an upper chuck and a lower chuck.

Now, configurations of the upper chuck 140 and the lower chuck 141 will be explained with reference to FIG. 6. FIG. 6 is a schematic side sectional view illustrating the configurations of the upper chuck 140 and the lower chuck 141.

As illustrated in FIG. 6, the upper chuck 140 has a main body 170 having a diameter equal to or larger than that of the upper wafer W1.

The main body 170 is supported by a supporting member 180 of the upper chuck holding unit 150. The supporting member 180 is configured to cover at least the main body 170 when viewed from the top and is fixed to the main body 170 by screwing, for example. The supporting member 180 is supported by a plurality of supporting columns 181 (see FIG. 5) provided at the ceiling surface of the processing vessel 100.

A through hole 176 is formed through central portions of the supporting member 180 and the main body 170 in the vertical direction. A position of the through hole 176 corresponds to the central portion of the upper wafer W1 attracted to and held by the upper chuck 140. A push pin 191 of a striker 190 is inserted through the through hole 176.

The striker 190 is provided on a top surface of the supporting member 180 and is equipped with the push pin 191, an actuator unit 192 and a linearly moving mechanism 193. The push pin 191 is a cylindrical member extended along the vertical direction and is supported by the actuator unit 192.

The actuator unit 192 is configured to generate a constant pressure in a certain direction (here, vertically downward direction) by air supplied from, for example, an electro-pneumatic regulator (not shown). By the air supplied from the electro-pneumatic regulator, the actuator unit 192 is capable of controlling a press load applied to the central portion of the upper wafer W1 as it is brought into contact with the central portion of the upper wafer W1. Further, a leading end of the push pin 191 is movable up and down in the vertical direction through the through hole 176 by the air from the electro-pneumatic regulator.

The actuator unit 192 is supported at the linearly moving mechanism 193. The linearly moving mechanism 193 moves the actuator unit 192 in the vertical direction by a driving unit including a motor, for example.

The striker 190 is configured as described above, and controls a movement of the actuator unit 192 by the linearly moving mechanism 193 and controls the press load upon the upper wafer W1 from the push pin 191 by the actuator unit 192.

A plurality of pins 170a is provided on a bottom surface of the main body 170, and these pins 170a are in contact with the rear surface (non-bonding surface W1n shown in FIG. 3) of the upper wafer W1.

At a part of the region where the pins 170a are provided, the upper chuck 140 has an attraction region for attracting the upper wafer W1. In the present exemplary embodiment, this attraction region is provided depending on anisotropy of a physical property of the upper wafer W1.

Figure 7:
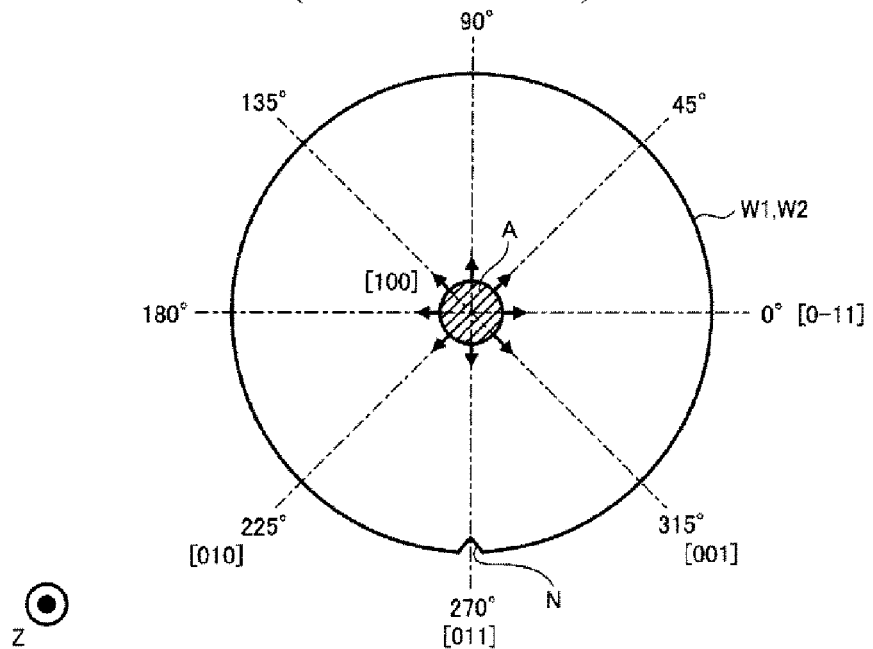
FIG. 7 is a diagram illustrating expansion of a bonding region in a conventional art.
Figure 8:
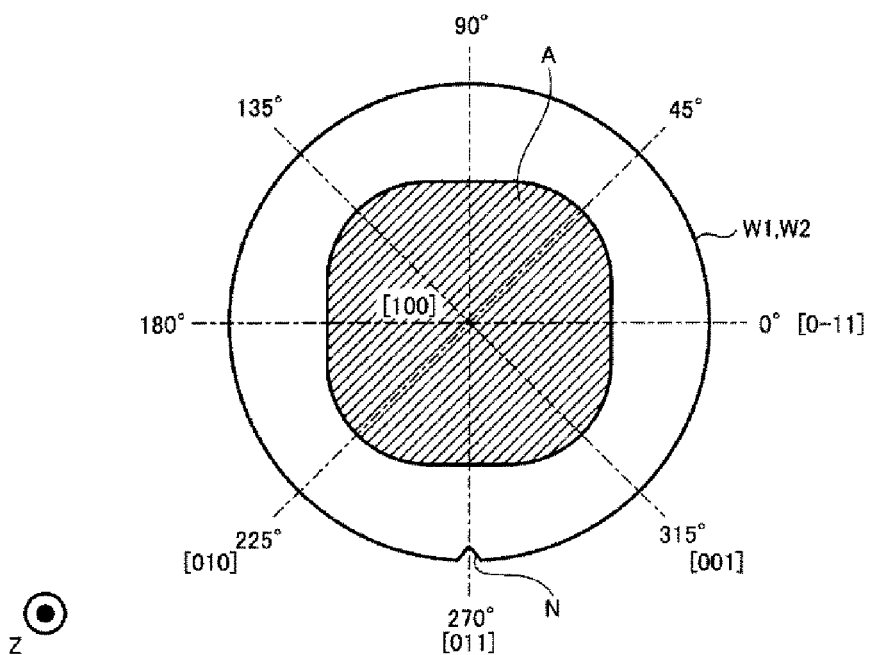
FIG. 8 is a diagram illustrating expansion of the bonding region in the conventional art.
Figure 9:
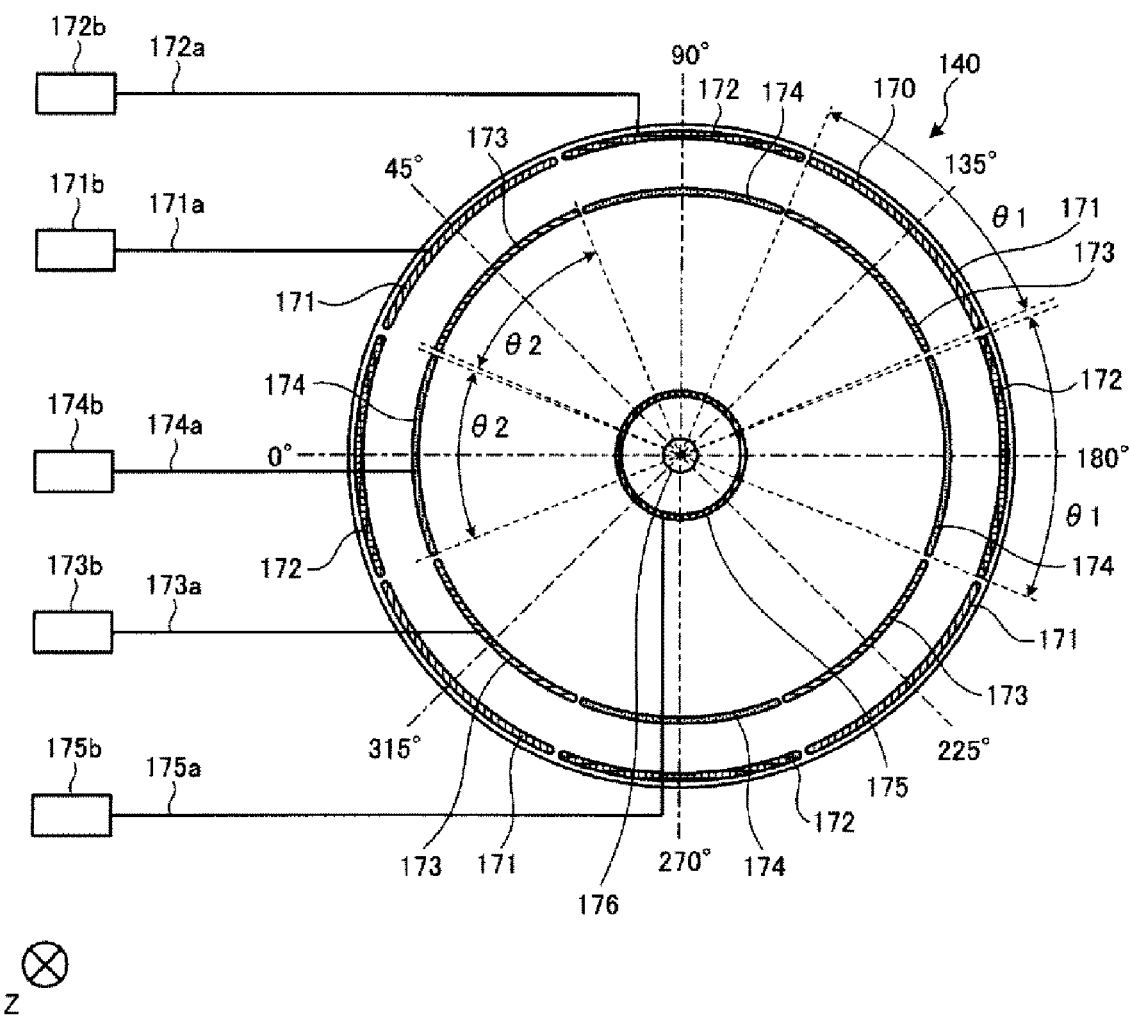
FIG. 9 is a schematic bottom view of the upper chuck.

Here, the attraction region of the upper chuck 140 will be explained with reference to FIG. 7 to FIG. 9. FIG. 7 and FIG. 8 are diagrams illustrating expansion of a bonding region in a conventional art. FIG. 9 is a schematic bottom view of the upper chuck 140.

As illustrated in FIG. 7, each of the upper wafer W1 and the lower wafer W2 is a single crystal silicon wafer in which a crystal direction in a direction perpendicular to the surface (bonding surface) thereof is [100]. The notches N of the upper wafer W1 and the lower wafer W2 are formed at edges of the upper wafer W1 and the lower wafer W2 in a crystal direction of [011]. Further, each of the upper wafer W1 and the lower wafer W2 has a diameter of, for example, 300 mm.

If the central portion of the upper wafer W1 is pushed down and brought into contact with a central portion of the lower wafer W2, the central portions of the upper wafer W1 and the lower wafer W2 are bonded by the intermolecular force, so that an bonding region A is formed at the central portions of both substrates. Then, a bonding wave is generated, whereby the bonding region A is expanded from the central portions of the substrates toward the peripheral portions thereof. As a result, the entire bonding surfaces W1j and W2j of the wafers W1 and W2 are bonded.

Here, the present inventors found out that the bonding region A is not expanded in a concentric shape but in a non-uniform manner in case that the aforementioned bonding processing is performed while holding the upper wafer with the holding unit which holds the entire circumference of the peripheral portion of the upper wafer.

To elaborate, as depicted in FIG. 8, the bonding region A is expanded faster toward directions at a cycle of 90° (directions of 45°, 135°, 225° and 315° shown in FIG. 8, hereinafter referred to as "45° directions") with respect to a direction oriented toward a [010] crystal direction parallel to the surface of the upper wafer W1 from the central portion of the upper wafer W1, as compared to directions at a cycle of 90° (directions of 0°, 90°, 180° and 270° shown in FIG. 8, hereinafter referred to as "90° directions") with respect to a direction oriented toward a [0-11] crystal direction parallel to the surface of the upper wafer W1 from the central portion of the upper wafer W1. As a result, as the bonding region A which originally has a circular shape is expanded, the bonding region A becomes closer to a rectangular shape with the 45° directions as vertices.

The present inventors repeated researches and found out that this non-uniform expansion is caused by the anisotropy of the physical property of the upper wafer W1 and the lower wafer W2 such as Young's modulus.

By way of example, values of Young's modulus, Poisson's ratio and shear modulus of the single crystal silicon wafer varies at a cycle of 90°. To elaborate, the Young's modulus of the single crystal silicon wafer is highest at a direction of 90° and is lowest at a direction of 45°. Further, the Poisson's ratio and the shear modulus are highest at the direction of 45° and lowest at the direction of 90°.

As stated above, since the single crystal silicon wafer has the anisotropy in the physical property such as the Young's modulus, a distribution of a stress applied to the upper wafer W1 and a deformation thereof becomes non-uniform, not in the concentric shape. It is deemed that this non-uniform distribution causes non-uniform expansion of the bonding region A, so that a deformation (distortion) of the combined wafer T is deteriorated.

Thus, in the present exemplary embodiment, the entire circumference of the peripheral portion of the upper wafer W1 is not held, but only peripheral regions of the upper wafer W1 in the 45° directions where the bonding region A is expanded fastest are held by using the upper chuck 140.

To be specific, as illustrated in FIG. 9, multiple suction portions 171 to 175 configured to attract the upper wafer W1 by vacuum evacuation are provided at the bottom surface of the main body 170 in the upper chuck 140. Each of the suction portions 171 to 175 has the same height as the pins 170a and comes into contact with the rear surface (non-bonding surface W1n) of the upper wafer W1.

First suction portions 171 and second suction portions 172 have circular arc-shaped attraction regions when viewed from the top, and are alternately arranged at a peripheral portion of the main body 170 along the circumference thereof at a regular distance.

A total number of four first suction portions 171 are arranged in the 45° directions of the upper wafer W1, and a total number of four second suction portions 172 are arranged in the 90° directions of the upper wafer W1. To elaborate, centers of the circular arc-shaped attraction regions of the first suction portions 171 are located at positions coincident with the 45° directions of the upper wafer W1, and centers of the circular arc-shaped attraction regions of the second suction portions 172 are located at positions coincident with the 90° directions of the upper wafer W1.

The four first suction portions 171 are connected to a single first vacuum pump 171b via first suction lines 171a. Further, the fourth second suction portions 172 are connected to a single second vacuum pump 172b via second suction lines 172a. The first suction portions 171 and the second suction portions 172 attract the upper wafer W1 through the vacuum evacuation by the first vacuum pump 171b and the second vacuum pump 172b. Here, for the purpose of clear understanding, a line configuration of only one of the multiple first suction portions 171 and a line configuration of only one of the multiple second suction portions 172 are illustrated.

Third suction portions 173 and fourth suction portions 174 have circular arc-shaped attraction regions when viewed from the top, and are alternately arranged at an inner side of the main body 170 than the first suction portions 171 and the second suction portions 172 along the circumference thereof at a regular distance.

Like the first suction portions 171, a total number of four third suction portions 173 are arranged in the 45° directions of the upper wafer W1. To elaborate, centers of the circular arc-shaped attraction regions of the third suction portions 173 are located at positions coincident with the 45° directions of the upper wafer W1. Further, each third suction portion 173 is positioned within a fan-shaped region formed by two imaginary lines connecting a center of the main body 170 and both ends of the first suction portion 171, and an edge of the first suction portion 171.

Like the second suction portions 172, a total number of four fourth suction portions 174 are arranged in the 90° directions of the upper wafer W1. To elaborate, centers of the circular arc-shaped attraction regions of the fourth suction portions 174 are located at positions coincident with the 90° directions of the upper wafer W1. Further, each fourth suction portion 174 is positioned within a fan-shaped region formed by two imaginary lines connecting the center of the main body 170 and both ends of the second suction region 172, and an edge of the second suction portion 172.

Desirably, an angle range $\theta 1$ of the first suction portion 171 and the second suction portion 172, that is, an angle $\theta 1$ formed by the two imaginary lines connecting the center of the main body 170 and the two ends of the first suction portion 171 (second suction portion 172) is equal to or higher than 38°. If $\theta 1$ is smaller than 38°, it may be difficult to hold the upper wafer W1 appropriately. More desirably, $\theta 1$ may be equal to or larger than 40° and equal to or smaller than 43°. That is to say, to reduce the non-uniformity of the bonding wave effectively, it is desirable to set an angle range of a gap (non-attraction portion) formed between the first suction portion 171 and the second suction portion 172 to be equal to or larger than 2° and equal to or smaller than 5°.

An angle range $\theta 2$ of the third suction portion 173 and the fourth suction portion 174, that is, an angle $\theta 2$ formed by the two imaginary lines connecting the center of the main body 170 and the two ends of the third suction portion 173 (fourth suction portion 174) is set to be smaller than the angle range $\theta 1$ of the first suction portion 171 (second suction portion 172). By way of non-limiting example, when $\theta 1$ is 43°, $\theta 2$ is set to be 41°.

The four third suction portions 173 are connected to a single third vacuum pump 173b via third suction lines 173a.

Further, the four fourth suction portions 174 are connected to a single fourth vacuum pump 174b via fourth suction lines 174a. The third suction portions 173 and the fourth suction portions 174 attract the upper wafer W1 through the vacuum evacuation by the third vacuum pump 173 and the fourth vacuum pump 174. Here, for the purpose of clear understanding, the line configuration of only one of the multiple third suction portions 173 and a line configuration of only one of the multiple fourth suction portions 174 are illustrated.

A fifth suction portion 175 is provided at an inner side of the main body 170 than the third suction portions 173 and the fourth suction portions 174. The fifth suction portion 175 has a circular ring-shaped attraction region when viewed from the top. The fifth suction portion 175 is connected to a single fifth vacuum pump 175b via a fifth suction line 175a. The fifth suction portion 175 attracts the upper wafer W1 through the vacuum evacuation by the fifth vacuum pump 175b.

As stated above, if a direction oriented toward the crystal direction of [0-11] parallel to the surface of the upper wafer W1 from the central portion of the upper wafer W1 is defined as 0°, the multiple first suction portions 171 and the multiple third suction portions 173 are arranged at an interval of 90° with respect to the direction of 45°, and the multiple second suction portions 172 and the multiple fourth suction portions 174 are arranged at an interval of 90° with respect to the direction of 0°. Further, the upper chuck 140 is capable of controlling an attraction force (including presence/absence of attraction) and an attraction timing for each of the first to fifth suction portions 171 to 175.

Figure 10:
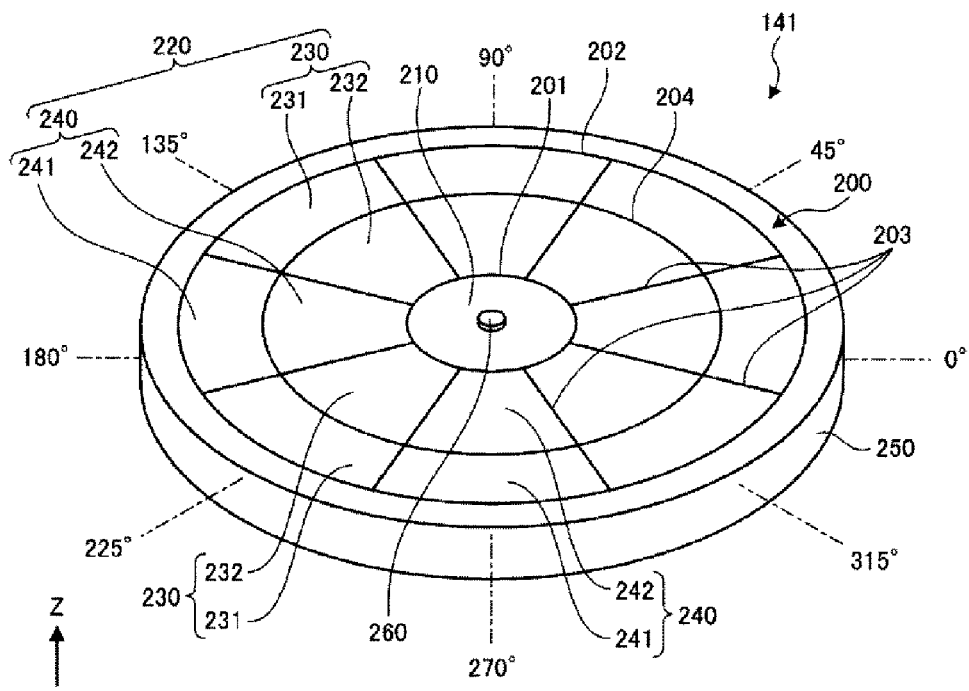
FIG. 10 is a schematic perspective view of the lower chuck.
Figure 11:
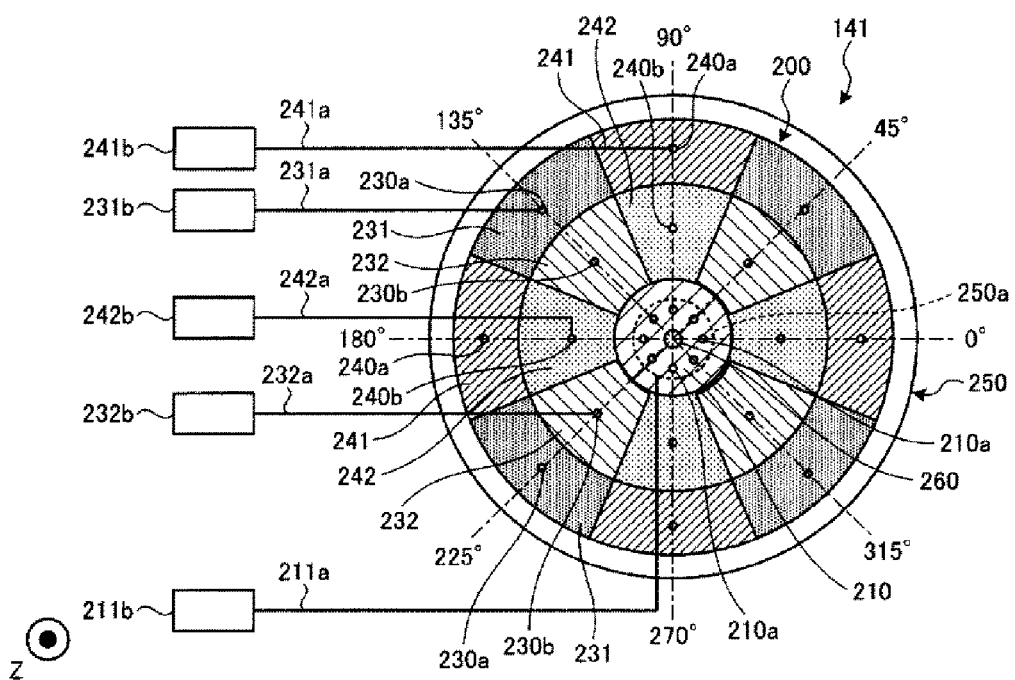
FIG. 11 is a schematic plan view of the lower chuck.
Figure 12:
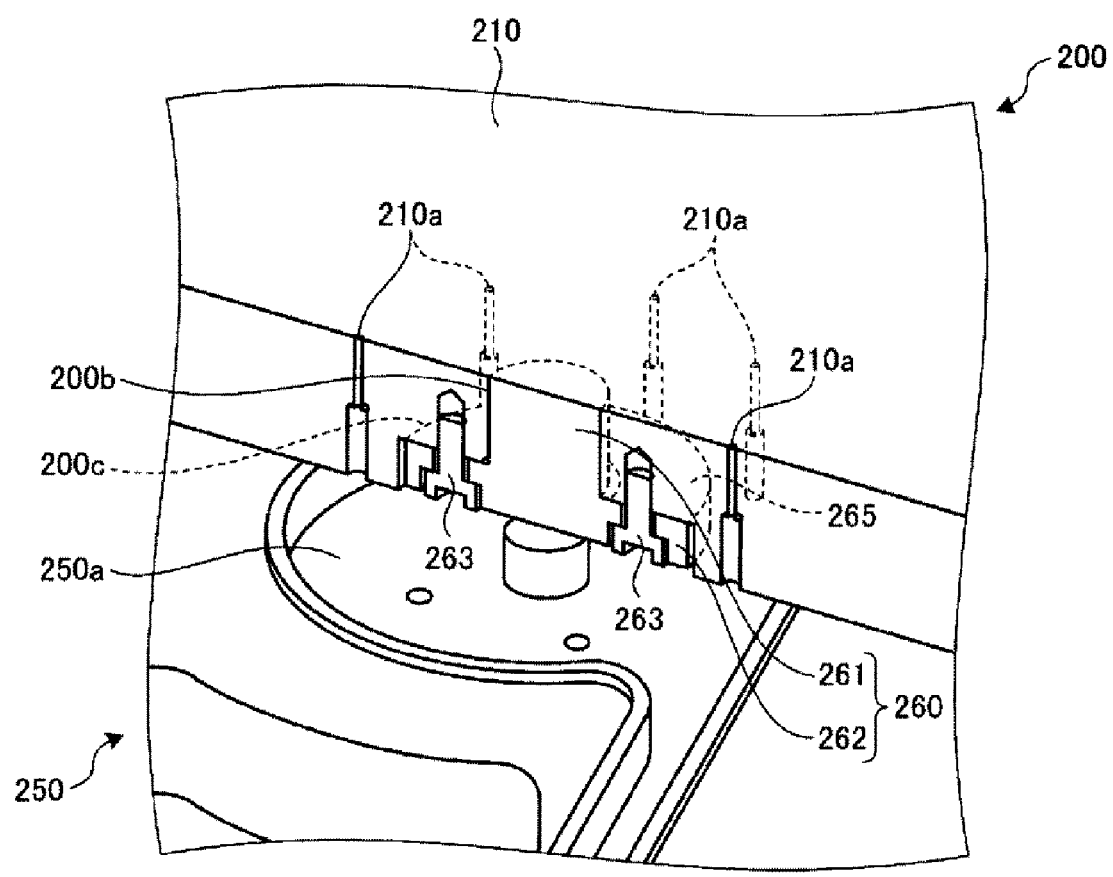
FIG. 12 is a schematic perspective sectional view illustrating a configuration of a protrusion part.

Now, a configuration of the lower chuck 141 will be discussed with reference to FIG. 6 and FIG. 10 to FIG. 12. FIG. 10 is a schematic perspective view of the lower chuck 141. FIG. 11 is a schematic plan view of the lower chuck 141, and FIG. 12 is a schematic perspective sectional view illustrating a configuration of a protrusion part 260.

As depicted in FIG. 6, the lower chuck 141 includes a pad unit 200 having a diameter equal to or larger than the lower wafer W2; and a base body 250 provided under the pad unit 200. Multiple pins 200a which come into contact with the rear surface (non-bonding surface W2n) of the lower wafer W2 are provided on a top surface of the pad unit 200.

Further, a through hole 200b is formed through a central portion of the pad unit 200 in the vertical direction. A position of the through hole 200b corresponds to the central portion of the lower wafer W2 attracted to and held by the lower chuck 141. Furthermore, the position of the through hole 200b also corresponds to the position of the through hole 176 formed in the upper chuck 140.

A main body 261 of the protrusion part 260 to be described later is inserted through the through hole 200b. The main body 261 is protruded from the through hole 200b up to a position higher than the pins 200a and supports the central portion of the lower wafer W2 at a higher position than the rest portion of the lower wafer W2. The main body 261 is provided at a position facing the push pin 191 of the striker 190.

As stated above, the upper wafer is brought into contact with the lower wafer in the state that it is bent by the striker. As a result, a stress is applied to the upper wafer, and the combined wafer may be distorted due to this stress.

Recently, there has been proposed a method of reducing a deformation of the combined wafer by forming an entire holding surface of the lower chuck in a convex shape and maintaining the lower wafer thereon in a bent state. In this conventional method, however, it has been difficult to cope with a local deformation of the central portion of the combined wafer caused by the striker.

From this consideration, in the bonding apparatus 41 according to the present exemplary embodiment, the protruding part is provided at the position of the lower chuck 141 facing the striker 190. With this configuration, the two wafers W1 and W2 can be joined in the state that the same stress as the local stress applied to the central portion of the upper wafer W1 by the striker 190 is applied to the lower wafer W2. Thus, the local deformation caused by the striker 190 can be reduced.

A top surface of the main body 261 of the protrusion part 260 has a diameter equal to a diameter of a bottom surface of the push pin 191 of the striker 190. Accordingly, a stress closer to the local stress applied to the upper wafer W1 by the push pin 191 can be applied to the lower wafer W2.

As shown in FIG. 10, the pad unit 200 has a first rib 201 and a second rib 202. The first rib 201 and the second rib 202 are arranged in a concentric shape in the order of the first rib 201 and the second rib 202 from an inner side with respect to a center of the pad unit 200. The first rib 201 and the second rib 202 have the same height as the pins 200a. The second rib 202 is provided at a peripheral portion of the pad unit 200 and supports a peripheral portion of the lower wafer W2.

With the first rib 201 and the second rib 202, the top surface of the pad unit 200 is partitioned into an inner attraction region 210 for attracting a region including the central portion of the lower wafer W2; and an outer attraction region 220 for attracting a region including the peripheral portion of the lower wafer W2.

The outer attraction region 220 has a planar shape. In other words, the outer attraction region 220 attracts the lower wafer W2 by the multiple pins 200a in a planar manner. Meanwhile, the portion of the inner attraction region 210 facing the striker 190 is protruded due to the presence of the protrusion part 260, as mentioned above. The rest portion of the inner attraction region 210 other than the protrusion part 260 is of a planar shape.

Further, the pad unit 200 is equipped with a multiple number of third ribs 203 extended in a radial shape from the first rib 201 toward the second rib 202. The outer attraction region 220 is partitioned by these third ribs 203 into multiple division regions 230 and 240 which are arranged alternately along the circumferential direction thereof.

Among the multiple division regions 230 and 240, the first division regions 230 are placed in a first direction, among directions from the central portion of the lower wafer W2 toward the peripheral portion thereof, where the bonding region A (see FIG. 7) between the upper wafer W1 and the lower wafer W2 is expanded fastest. Further, among the multiple division regions 230 and 240, the second division regions 240 are arranged next to the first division regions 230 in the circumferential direction and are placed in a second direction, among the directions from the central portion of the lower wafer W2 toward the peripheral portion thereof, where the bonding region A is expanded slowly as compared to that in the first direction.

To elaborate, if a direction oriented toward the crystal direction of [0-11] parallel to the surface of the lower wafer W2 from the central portion of the lower wafer W2 is defined as 0°, the multiple first division regions 230 are arranged at an interval of 90° with respect to the direction of 45°, and the multiple second division regions 240 are arranged at an interval of 90° with respect to the direction of 0°. That is, the multiple first division regions 230 are arranged in the 45° directions, like the first suction portions 171 of the upper chuck 140, whereas the multiple second division regions 240 are arranged in the 90° directions, like the second suction portions 172 of the upper chuck 140.

Further, the pad unit 200 further includes a fourth rib 204. The forth rib 204 is provided between the first rib 201 and the second rib 202 in a concentric shape with respect to the first rib 201 and the second rib 202. With this fourth rib 204, each of the first division regions 230 is partitioned into a first outer division region 231 and a first inner division region 232, and each of the second division regions 240 is partitioned into a second outer division region 241 and a second inner division region 242. The first outer division region 231 and the first inner division region 232 have the same attraction area. Likewise, the second outer division region 241 and the second inner division region 242 have the same attraction area.

As depicted in FIG. 11, multiple first suction openings 210a are formed in a region of the pad unit 200 corresponding to the inner attraction region 210. These multiple first suction openings 210a are arranged circumferentially to surround the protrusion part 260. Further, a suction space 250a communicating with the multiple first suction openings 210a is formed in the base body 250, and the suction space 250a is connected to a first vacuum pump 211b via a first suction line 211a. With this configuration, by arranging the multiple first suction openings 210a around the protrusion part 260, the central portion of the lower wafer W2 can be attracted uniformly along the circumferential direction thereof.

Furthermore, a second suction opening 230a, a third suction opening 230b, a fourth suction opening 240a and a fifth suction opening 240b are formed in regions of the pad unit 200 corresponding to each first outer division region 231, each first inner division region 232, each second outer division region 241 and each second inner division region 242, respectively. By way of example, the second suction opening 230a, the third suction opening 230b, the fourth suction opening 240a and the fifth suction opening 240b are formed in central portions of the first outer division region 231, the first inner division region 232, the second outer division region 241 and the second inner division region 242, respectively.

The second suction openings 230a, the third suction openings 230b, the fourth suction openings 240a and the fifth suction openings 240b are connected to a second vacuum pump 231b, a third vacuum pump 232b, a fourth vacuum pump 241b and a fifth vacuum pump 242b via second suction lines 231a, third suction lines 232a, fourth suction lines 241a and fifth suction lines 242a, respectively.

With this configuration, the lower chuck 141 is capable of controlling the attraction force (including the presence/absence of attraction) and the attraction timing for each of the inner attraction region 210, the first outer division regions 231, the first inner division regions 232, the second outer division regions 241 and the second inner division regions 242.

Further, in FIG. 11, for the purpose of clear understanding, the line configuration of only one of the multiple first outer division regions 231, the line configuration of only one of the multiple first inner division regions 232, the line configuration of only one of the multiple second outer division regions 241 and the line configuration of only one of the multiple second inner division regions 242 are illustrated.

As depicted in FIG. 12, the protrusion part 260 is provided to be attachable and detachable with respect to the inner attraction region 210. To elaborate, the protrusion part 260 includes a vertically extended cylindrical main body 261; and a flange portion 262 which is provided at a base end of the main body 261 and has a larger diameter than the main body 261. Further, formed in the inner attraction region 210 of the pad unit 200 are a through hole 200b and a recess 200c which communicates with the through hole 200b and is provided on a bottom surface of the inner attraction region 210. The main body 261 of the protrusion part 260 is inserted through the through hole 200b from the bottom surface side of the inner attraction region 210 and then protruded to a top surface of the inner attraction region 210. The flange portion 262 of the protrusion part 260 is fitted into the recess 200c of the inner attraction region 210 to be in contact with the recess 200c. The protrusion part 260 is fixed to the inner attraction region 210 by a fixing member 263 such as a screw.

In addition, a shim member 265 configured to adjust a protruding amount of the main body 261 from the inner attraction region 210 is provided between the recess 200c of the inner attraction region 210 and the flange portion 262 of the protrusion part 260.

As stated above, by configuring the protrusion part 260 to be attachable to and detachable from the inner attraction region 210 and allowing the protruding amount of the main body 261 to be adjusted by the shim member 265, it may be possible to change a push-up amount of the lower wafer W2 by the protrusion part 260 easily depending on a variation of a push-down amount of the upper wafer W1 by the striker 190, for example.

3. Specific Operation of Bonding System

Figure 13:
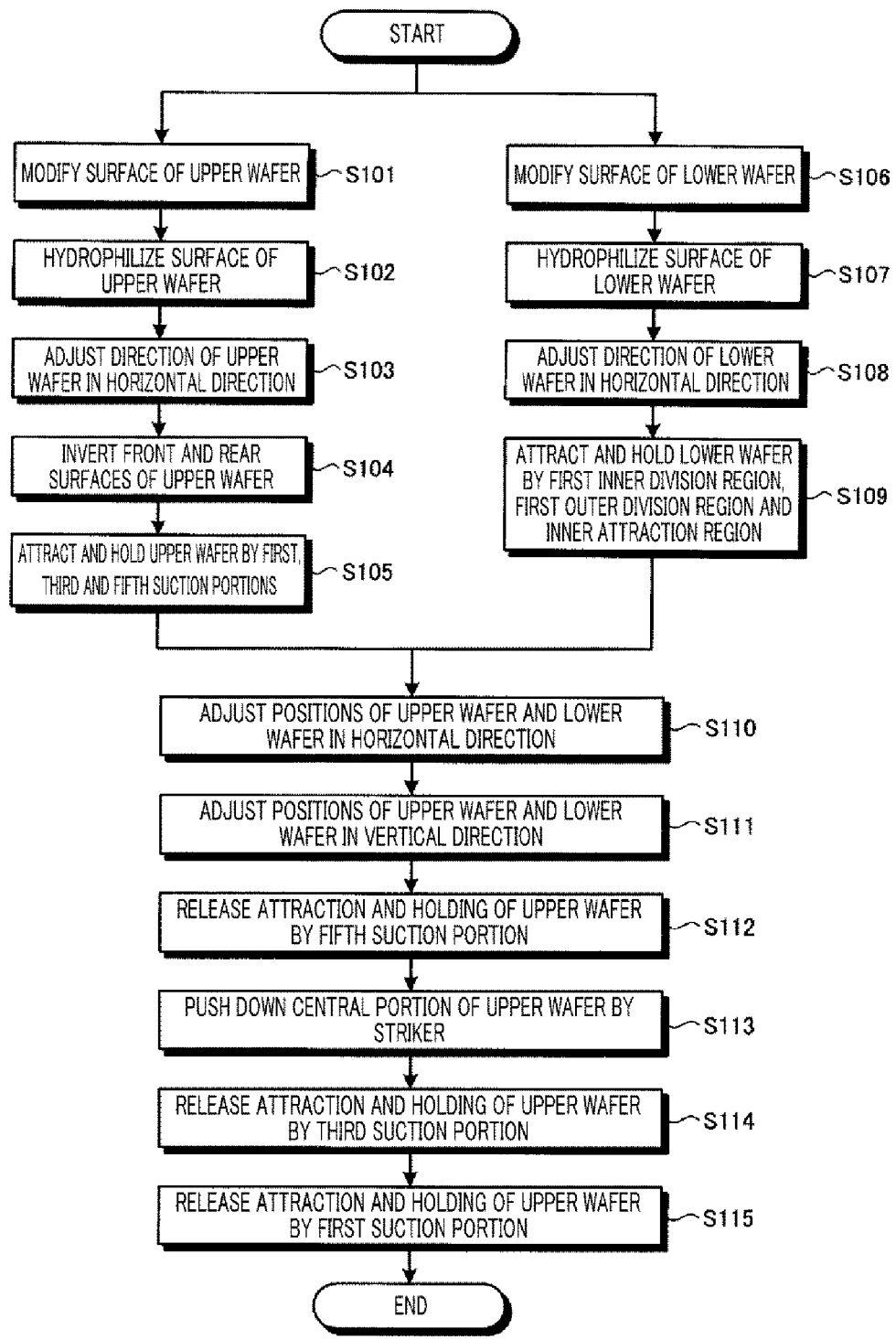
FIG. 13 is a flowchart illustrating a part of a processing performed by the bonding system.
Figure 14:
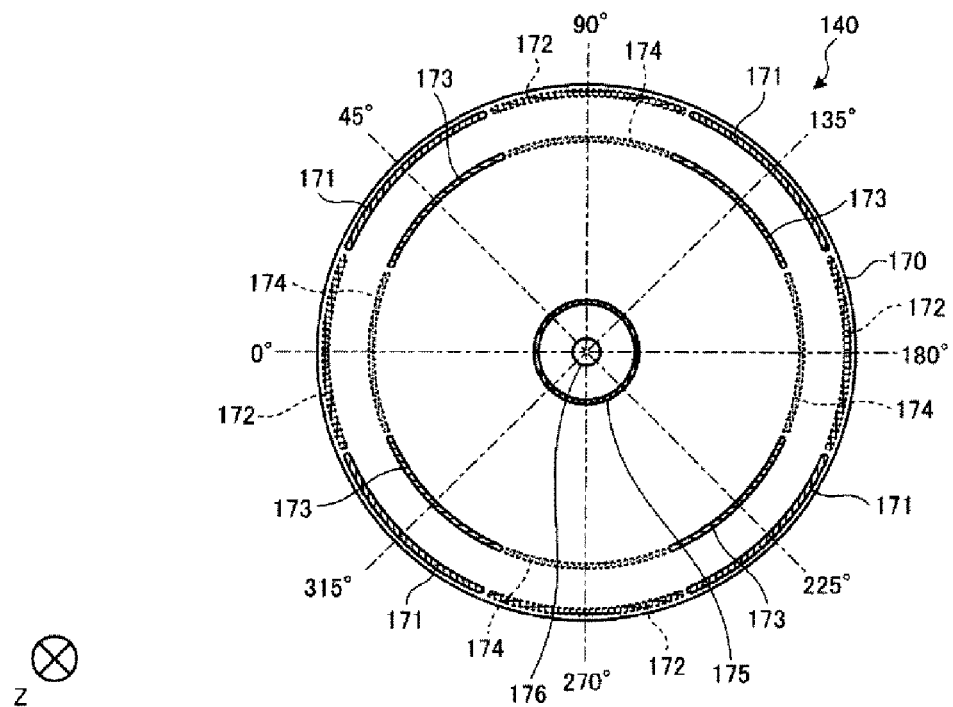
FIG. 14 is a diagram illustrating suction portions of the upper chuck for use in a bonding processing according to the exemplary embodiment.
Figure 15:
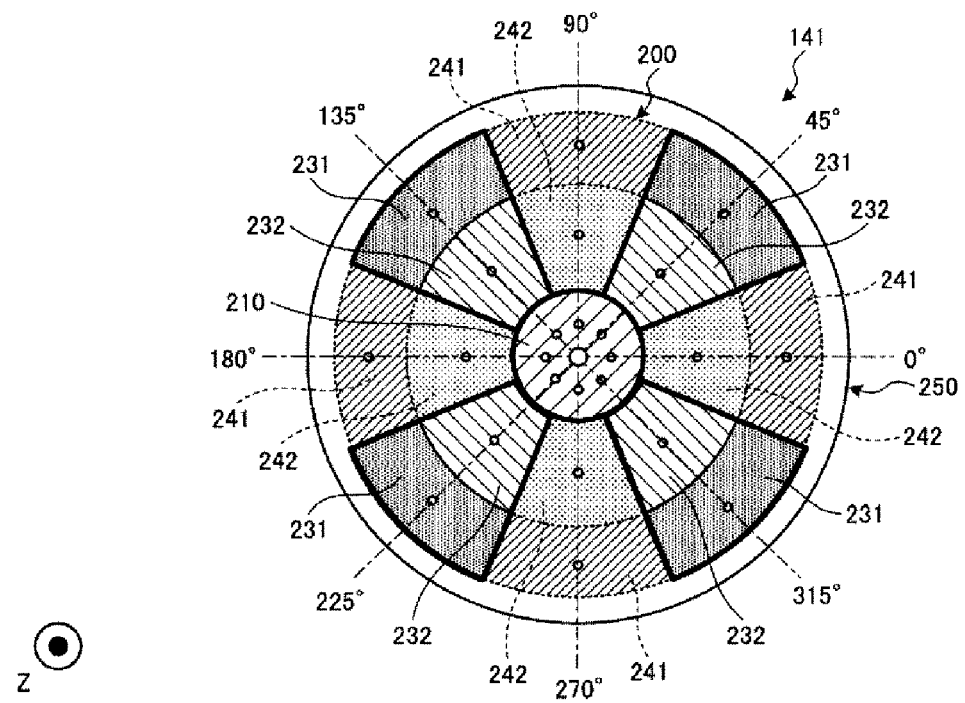
FIG. 15 is a diagram illustrating attraction regions of the lower chuck for use in the bonding processing according to the exemplary embodiment.
Figure 16:
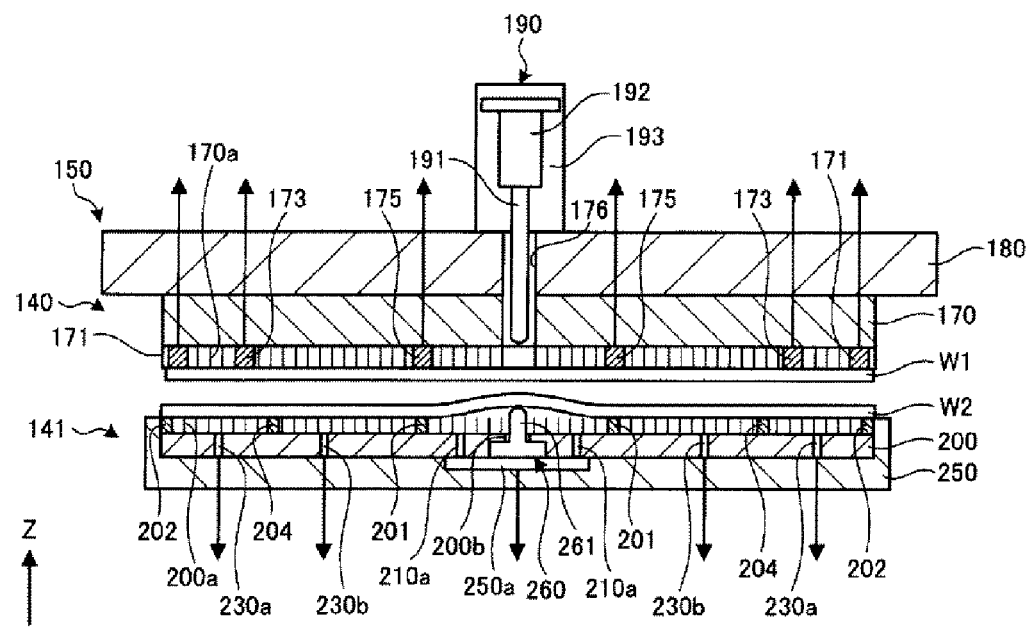
FIG. 16 is a diagram for describing an operation of the bonding processing.

Now, a specific operation of the bonding system 1 will be explained with reference to FIG. 13 to FIG. 20. FIG. 13 is a flowchart for describing a part of a processing performed by the bonding system 1. FIG. 14 is a diagram illustrating the suction portions of the upper chuck 140 for use in the bonding processing according to the present exemplary embodiment. FIG. 15 is a diagram illustrating the attraction regions of the lower chuck 141 for use in the bonding processing according to the present exemplary embodiment. FIG. 16 to FIG. 20 are diagrams for describing operations of the bonding processing. Further, various processings shown in FIG. 13 are performed under the control of the control device 70.

First, a cassette C1 accommodating a plurality of upper wafers W1, a cassette C2 accommodating a plurality of lower wafers W2 and an empty cassette C3 are placed on the preset placing plates 11 of the carry-in/out station 2. Then, an upper wafer W1 is taken out of the cassette C1 by the transfer device 22 and is transferred to the transition device 50 of the third processing block G3 of the processing station 3.

Subsequently, the upper wafer W1 is transferred into the surface modifying apparatus 30 of the first processing block G1 by the transfer device 61. In the surface modifying apparatus 30, an oxygen gas as the processing gas is excited into plasma and ionized under the preset decompressed atmosphere. The oxygen ions are irradiated to the bonding surface W1j of the upper wafer W1, and the bonding surface W1j is plasma-processed. As a result, the bonding surface W1j of the upper wafer W1 is modified (process S101).

Then, the upper wafer W1 is transferred into the surface hydrophilizing apparatus 40 of the second processing block G2 by the transfer device 61. In the surface hydrophilizing apparatus 40, the pure water is supplied onto the upper wafer W1 while rotating the upper wafer W1 held by the spin chuck. The supplied pure water is diffused on the bonding surface W1*j* of the upper wafer W1, and hydroxyl groups (silanol groups) adhere to the bonding surface W1*j* of the upper wafer W1 modified in the surface modifying apparatus 30, so that the bonding surface W1*j* is hydrophilized. Further, the bonding surface W1*j* of the upper wafer W1 is cleaned by the corresponding pure water (process S102).

Thereafter, the upper wafer W1 is transferred into the bonding apparatus 41 of the second processing block G2 by the transfer device 61. The upper wafer W1 carried into the bonding apparatus 41 is then transferred into the position adjusting mechanism 120 through the transition 110 by the wafer transfer mechanism 111. Then, the direction of the upper wafer W1 in the horizontal direction is adjusted by the position adjusting mechanism 120 (process S103).

Afterwards, the upper wafer W1 is delivered onto the holding arm 131 of the inverting mechanism 130 from the position adjusting mechanism 120. Then, in the transfer region T1, by inverting the holding arm 131, the front surface and the rear surface of the upper wafer W1 are inverted (process S104). That is, the bonding surface W1*j* of the upper wafer W1 is turned to face down.

Thereafter, the holding arm 131 of the inverting mechanism 130 is moved to be located under the upper chuck 140 by being rotated. The upper wafer W1 is then transferred to the upper chuck 140 from the inverting mechanism 130. Specifically, the non-bonding surface W1*n* of the upper wafer W1 is attracted to and held by the upper chuck 140 in the state that the notch N of the upper wafer W1 is oriented to a predetermined direction, that is, in a direction where the second suction portion 172 and the fourth suction portion 174 are provided (process S105).

In the process S105, the upper chuck 140 attracts and holds the upper wafer W1 by using, among the first to fifth suction portions 171 to 175, the first suction portions 171 and the third suction portions 173 arranged at the 45° directions as well as the fifth suction portion 175 (see FIG. 14).

While the above-described processes S101 to S105 are being performed on the upper wafer W1, a processing of the lower wafer W2 is performed. First, the lower wafer W1 is taken out of the cassette C2 by the transfer device 22 and transferred into the transition device 50 of the processing station 3 by the transfer device 22.

Thereafter, the lower wafer W2 is transferred into the surface modifying apparatus 30 by the transfer device 61, and the bonding surface W2*j* of the lower wafer W2 is modified (process S106). Further, the modification of the bonding surface W2*j* of the lower wafer W2 in the process S106 is the same as the above-stated process S101.

Subsequently, the lower wafer W2 is transferred into the surface hydrophilizing apparatus 40 by the transfer device 61, so that the bonding surface W2*j* of the lower wafer W2 is hydrophilized and cleaned (process S107). The hydrophilizing and the cleaning of the bonding surface W2*j* of the lower wafer W2 in the process S107 are the same as those in the above-described process S102.

Then, the lower wafer W2 is transferred into the bonding apparatus 41 by the transfer device 61. The lower wafer W2 carried into the bonding apparatus 41 is transferred into the position adjusting mechanism 120 through the transition 110 by the wafer transfer mechanism 111. Then, the direction of the lower wafer W2 in the horizontal direction is adjusted by the position adjusting mechanism 120 (process S108).

Afterwards, the lower wafer W2 is transferred onto the lower chuck 141 by the wafer transfer mechanism 111 and attracted to and held by the lower chuck 141 (process S109).

Here, the non-bonding surface W2*n* of the lower wafer W2 is attracted to and held by the lower chuck 141 in the state that the notch N of the lower wafer W2 is oriented to a predetermined direction which is the same as the direction of the notch N of the upper wafer W1, that is, in a direction where the first outer division region 231 and the first inner division region 232 are provided.

In the process S109, the lower chuck 141 attracts and holds the lower wafer W2 by using, among the inner attraction region 210, the first outer division regions 231, the first inner division regions 232, the second outer division regions 241 and the second inner division regions 242, the first outer division regions 231 and the first inner division regions 232 arranged at the 45° direction as well as the inner attraction region 210 (see FIG. 15).

Subsequently, the horizontal positions of the upper wafer W1 held by the upper chuck 140 and the lower wafer W2 held by the lower chuck 141 are adjusted (process S110).

Then, the vertical positions of the upper wafer W1 held by the upper chuck 140 and the lower wafer W2 held by the lower chuck 141 are adjusted (process S111). To elaborate, as the first lower chuck moving unit 160 moves the lower chuck 141 in the vertical direction, the lower wafer W2 approaches the upper wafer W1. Accordingly, a distance between the bonding surface W2*j* of the lower wafer W2 and the bonding surface W1*j* of the upper wafer W1 is adjusted to a preset distance, for example, 50 μm to 200 μm (see FIG. 16).

Figure 17:
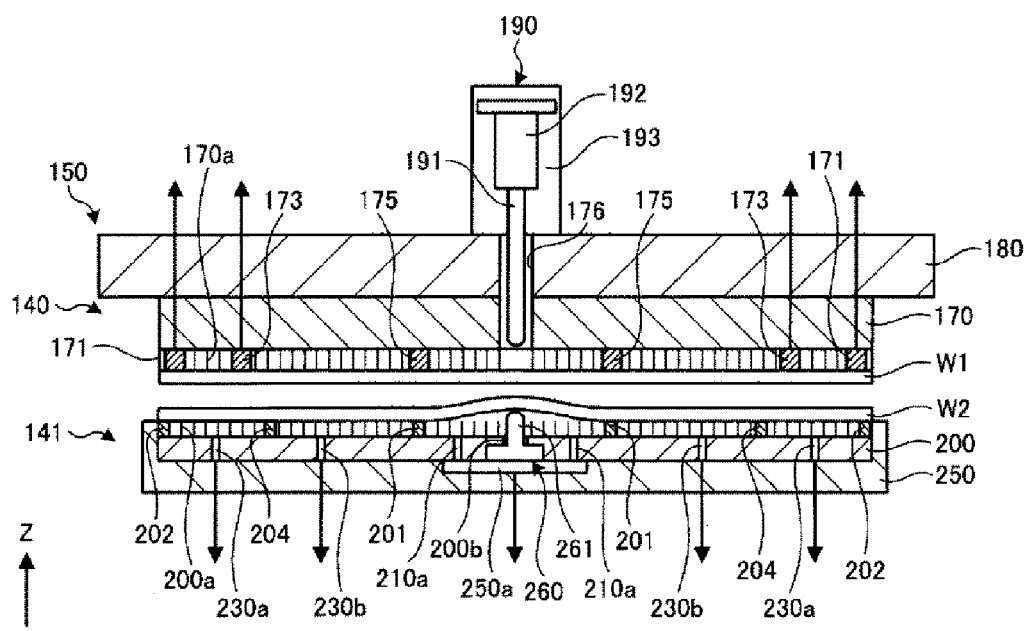
FIG. 17 is a diagram for describing an operation of the bonding processing.
Figure 18:
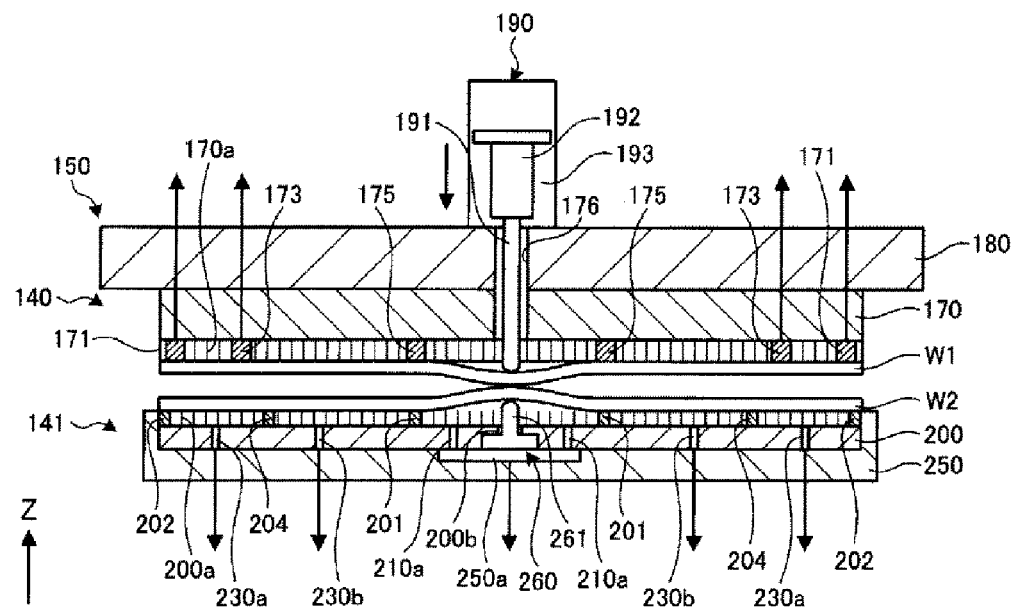
FIG. 18 is a diagram for describing an operation of the bonding processing.

Afterwards, as shown in FIG. 17, after releasing the attraction and the holding of the upper wafer W1 by the fifth suction portion 175 (process S112), as shown in FIG. 18, by lowering the push pin 191 of the striker 190, the central portion of the upper wafer W1 is pushed down (process S113). By maintaining the attraction and the holding of the central portion of the upper wafer W1 by using the fifth suction portion 175 until a time immediately before the upper wafer W1 is pushed down by the striker 190, a bending (for example, about 1 μm) of the central portion of the upper wafer W1 can be suppressed. Accordingly, in case of setting the distance between the upper wafer W1 and the lower wafer W2 to a narrow gap smaller than, e.g., 30 μm in the process S112, an increase of difficulty in adjusting parallelism between the upper chuck 140 and the lower chuck 141 can be suppressed.

If the central portion of the upper wafer W1 is brought into contact with a central portion of the lower wafer W2 and the central portion of the upper wafer W1 and the central portion of the lower wafer W2 are pressed at a preset force as the upper wafer W1 is pushed down by the striker 190, the bonding is started between the central portion of the upper wafer W1 and the central portion of the lower wafer W2 which are pressed against each other. That is, since the bonding surface W1*j* of the upper wafer W1 and the bonding surface W2*j* of the lower wafer W2 have been modified in the processes S101 and S106, respectively, Van der Waals force (intermolecular force) is generated between the bonding surfaces W1*j* and W2*j*, so that the bonding surfaces W1*j* and W2*j* are bonded. Further, since the bonding surface W1*j* of the upper wafer W1 and the bonding surface W2*j* of the lower wafer W2 have been hydrophilized in the processes S102 and S107, respectively, hydrophilic groups between the bonding surfaces W1*j* and W2*j* are hydrogen-bonded, so that the bonding surfaces W1*j* and W2*j* are firmly bonded. As a result, the bonding region A (see FIG. 7) is formed.

In the bonding apparatus 41 according to the present exemplary embodiment, the protrusion part 260 is provided at the position of the lower chuck 141 facing the striker 190.

Accordingly, in the state that the same stress as the local stress applied to the central portion of the upper wafer W1 by the striker 190 is applied to the lower wafer W2, the two wafers W1 and W2 are joined. Therefore, the local deformation of the combined wafer T that might be caused by the striker 190 can be reduced.

Thereafter, the bonding wave which is expanded from the central portions of the upper wafer W1 and the lower wafer W2 toward the peripheral portions thereof takes place between the upper wafer W1 and the lower wafer W2.

In the bonding apparatus 41 according to the present exemplary embodiment, the first to fourth suction portions 171 to 174 are arranged according to the anisotropy of the upper wafer W1, and the upper wafer W1 is attracted and held by using the first suction portions 171 and the third suction portions 173 arranged at the 45° directions in which the bonding region A is expanded fastest. That is to say, the upper wafer W1 is not attracted and held in the 90° directions in which the bonding region A is expanded most slowly.

Accordingly, as compared to the case where the entire circumference of the peripheral portion of the upper wafer W1 is attracted and held, the non-uniform distribution of the stress applied to the upper wafer W1 and the deformation thereof can be suppressed. As a result, the non-uniformity of the bonding wave is reduced, and the bonding region A can be expanded in a nearly concentric shape. As a result, in the bonding apparatus 41 according to the present exemplary embodiment, the deformation (distortion) of the combined wafer T can be reduced.

Furthermore, the present inventors also analyzed the stress distribution and the displacement amount of the combined wafer for each of cases of holding the entire circumference of the peripheral portion of the upper wafer, holding the upper wafer only in the 45° directions and holding the upper wafer only in the 90° directions, and it is confirmed that the stress distribution and the displacement amount of the combined wafer are most uniform in the case of holding the upper wafer only in the 45° directions.

Further, in the present exemplary embodiment, the lower chuck 141 is also designed to hold the lower wafer W2 only in the 45° directions, not the entire surface thereof, in the same manner as the upper chuck 140 holds the upper wafer W1. That is, among the first outer division regions 231, the first inner division regions 232, the second outer division regions 241 and the second inner division regions 242, the lower wafer W2 is attracted and held by using the first outer division regions 231 and the first inner division regions 232 arranged in the 45° directions.

Accordingly, since the stress states of the upper wafer W1 and the lower wafer W2 can be made same, the deformation (distortion) of the combined wafer T can be further reduced. However, the lower chuck 141 is not limited to holding the lower wafer W2 only in the 45° directions but may be configured to hold the entire surface of the lower wafer W2.

Figure 19:
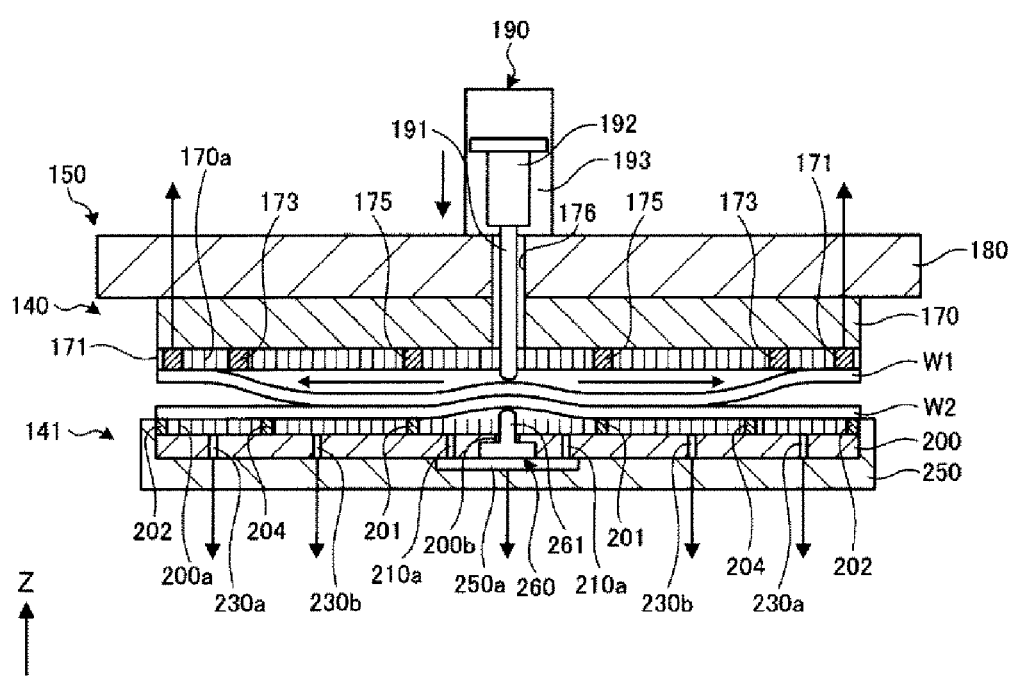
FIG. 19 is a diagram for describing an operation of the bonding processing.
Figure 20:
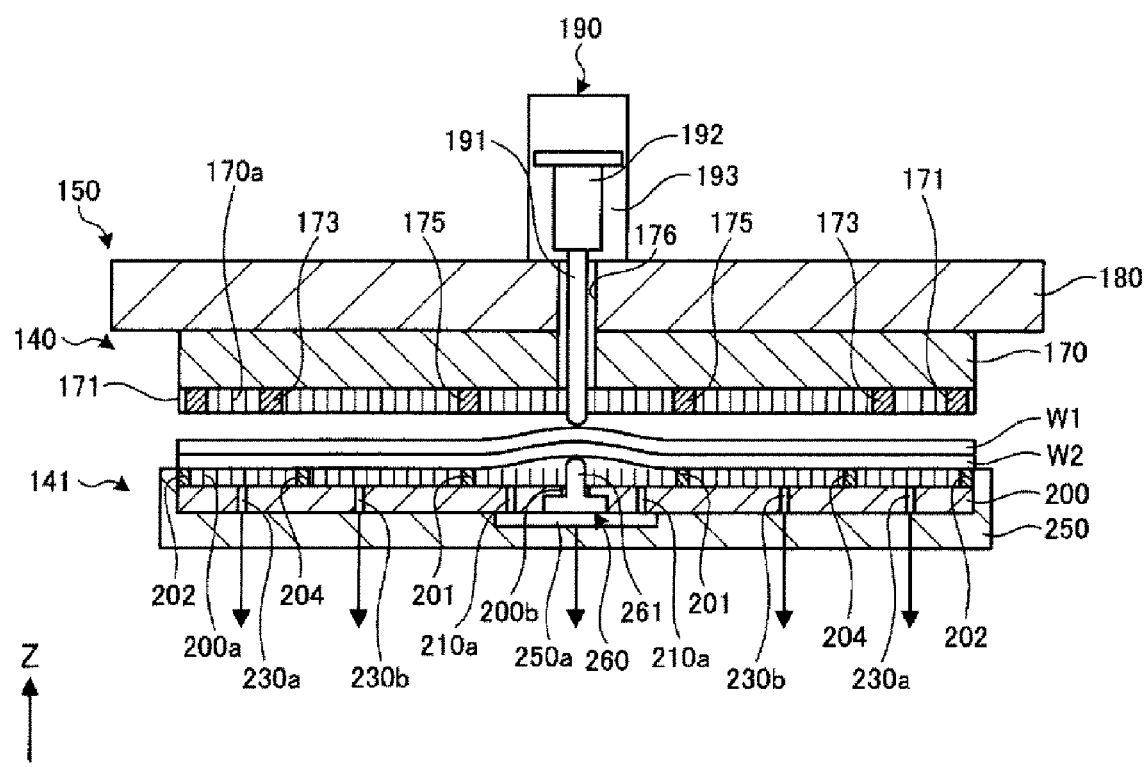
FIG. 20 is a diagram for describing an operation of the bonding processing.

Thereafter, as shown in FIG. 19, while pressing the central portion of the upper wafer W1 against the central portion of the lower wafer W2 by the push pin 191, the attraction and the holding of the upper wafer W1 by the third suction portions 173 is released (process S114). Thereafter, the attraction and the holding of the upper wafer W1 by the first suction portions 171 is released (process S115). As a result, as illustrated in FIG. 20, the upper wafer W1 and the lower wafer W2 are bonded to each other on the entire bonding surfaces W1j and W2j thereof.

Afterwards, the push pin 191 is raised up to the upper chuck 140, and the attraction and the holding of the lower wafer W2 by the lower chuck 141 is released. Then, the combined wafer T is transferred to the transition device 51 by the transfer device 61, and then, is transferred into the cassette C3 by the transfer device 22 of the carry-in/out station 2. Through these processes, the series of bonding processing are completed.

As stated above, the bonding apparatus 41 according to the present exemplary embodiment includes the upper chuck 140 (an example of a first holding unit), the lower chuck 141 (an example of a second holding unit) and the striker 190. The upper chuck 140 attracts and holds the upper wafer W1 (an example of the first substrate) from above. The lower chuck 141 is disposed under the upper chuck 140, and is configured to attract and hold the lower wafer W2 (an example of the second substrate) from below it. The striker 190 presses the central portion of the upper wafer W1 from above and brings the central portion of the upper wafer W1 into contact with the lower wafer W2. Further, the upper chuck 140 attracts and holds a part of the peripheral portion of the upper wafer W1. Specifically, among the directions from the central portion of the upper wafer W1 toward the peripheral portion thereof, the upper chuck 140 attracts and holds the regions of the upper wafer W1 intersecting with the direction in which the bonding region A between the upper wafer W1 and the lower wafer W2 is expanded fastest.

Accordingly, the non-uniformity of the bonding wave is reduced, and the bonding region A is expanded in a nearly concentric shape. Therefore, the deformation of the combined wafer T can be reduced.

Furthermore, the bonding apparatus 41 according to the present exemplary embodiment includes the upper chuck 140 (the example of the first holding unit), the lower chuck 141 (the example of the second holding unit) and the striker 190. The upper chuck 140 is configured to hold the upper wafer W1 (the example of the first substrate) from above. The lower chuck 141 (the example of the second holding unit) is disposed under the upper chuck 140, and is configured to attract and hold the lower wafer W2 from below. The striker 190 presses the central portion of the upper wafer W1 and brings it into contact with the lower wafer W2. Further, the lower chuck 141 includes the inner attraction region 210 configured to attract the region of the lower wafer W2 including the central portion thereof; and the outer attraction region 220 which is provided outside the inner attraction region 210 to be arranged concentrically with the inner attraction region 210 and is configured to attract the region of the lower wafer W2 including the peripheral portion thereof. Further, the inner attraction region 210 has the shape in which at least a part of the inner attraction region 210 facing the striker 190 is protruded, and the outer attraction region 220 has the planar shape.

Thus, according to the bonding apparatus 41 of the present exemplary embodiment, the local deformation caused by the striker 190 can be reduced.

4. Modification Example

Figure 21:
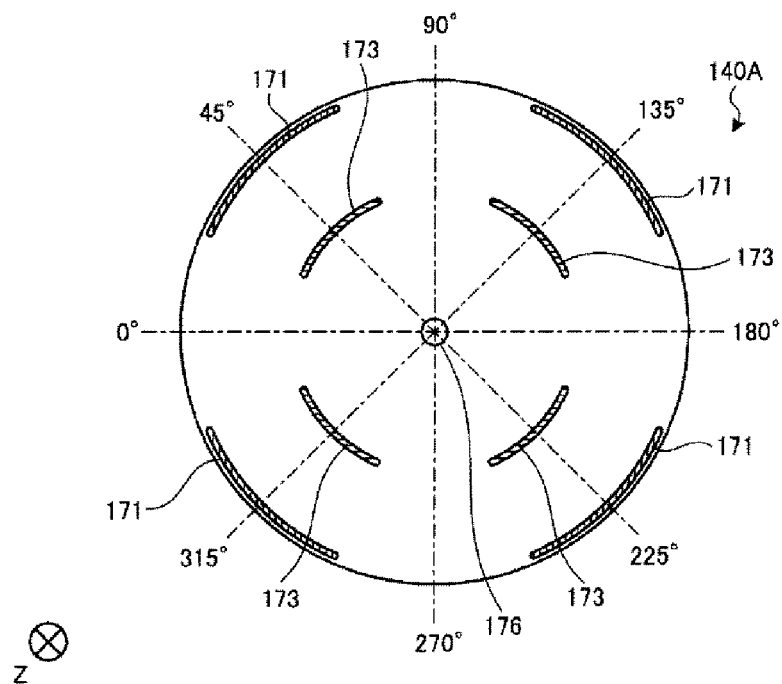
FIG. 21 is a schematic bottom view of an upper chuck according to a modification example.
Figure 22:
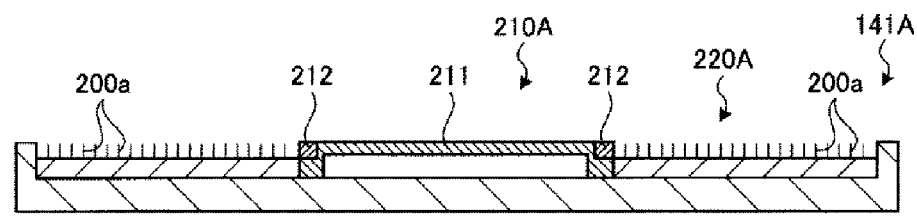
FIG. 22 is a schematic cross sectional view of a lower chuck according to the modification example.
Figure 22:
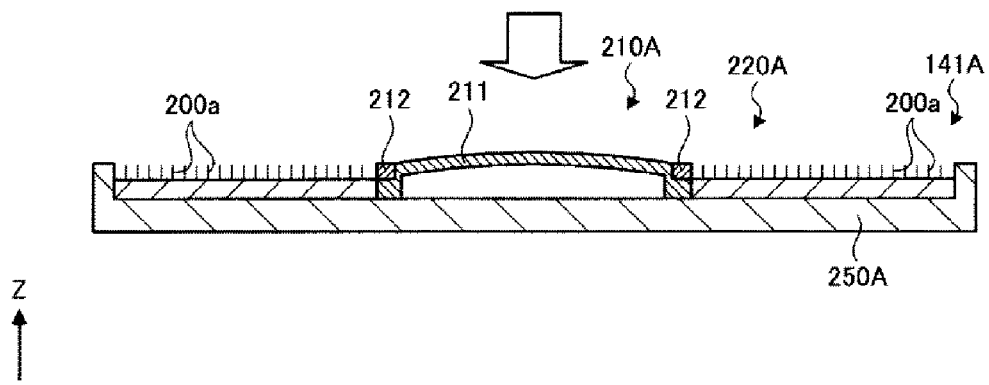

Now, a modification example of the above-described exemplary embodiment will be explained. FIG. 21 is a schematic bottom view of an upper chuck according to the modification example. FIG. 22 is a schematic cross sectional view of a lower chuck according to the modification example. In the following description, parts identical to those already described above will be assigned same reference numerals, and redundant description will be omitted.

In the above-described exemplary embodiment, in the bonding processing, the upper wafer W1 in the 45° directions are attracted and held by using only the first suction portions 171 and the third suction portions 173 of the upper chuck 140. That is to say, the second suction portions 172 and the fourth suction portions 174 configured to attract and hold the upper wafer W1 in the 90° directions are not used. If, however, there is a holding method in which the stress applied to the regions of the upper wafer W1 in the 90° directions becomes relatively smaller than the stress applied to the regions of the upper wafer W1 in the 45° directions, it may be possible to attract and hold the upper wafer W1 both in the 45° directions and the 90° directions.

In such a case, for example, the regions of the upper wafer W1 in the 90° directions may be attracted and held with a force smaller than a force for the regions of the upper wafer W1 in the 45° directions. That is, the upper chuck 140 may hold the regions of the upper wafer W1 in the 45° directions with a first attraction force by using the first suction portions 171 and the third suction portions 173 while holding the regions of the upper wafer W1 in the 90° directions with a second attraction force smaller than the first attraction force by using the second suction portions 172 and the fourth suction portions 174. Control of the attraction forces may be achieved by providing a pressure controller at a front end of each vacuum pump and controlling these pressure controllers under the control of the control device 70.

Further, after the upper chuck 140 pushes down the central portion of the upper wafer W1 by using the striker 190 while attracting and holding the upper wafer W1 by using the first to fourth suction portions 171 to 174, the attraction by the fourth suction portions 174 may be released at a timing earlier than a timing when the attraction by the third suction portions 173 is released. Further, the upper chuck 140 may release the attraction by the second suction portions 172 at a timing earlier than a timing when the attraction by the first suction portions 171 is released.

As stated above, by providing the first suction portions 171 and the third suction portions 173 corresponding to the 45° directions of the upper wafer W1 and the second suction portions 172 and the fourth suction portions 174 corresponding to the 90° directions of the upper wafer W1 and controlling these suction portions 171 to 174 individually, the velocities of the bonding wave in the 45° directions and the 90° directions can be adjusted more precisely. Accordingly, as compared to the case of using only the first suction portions 171 and the third suction portions 173 corresponding to the 45° directions, the deformation of the combined wafer T can be further reduced.

Moreover, in the above-described exemplary embodiment, though the third suction portions 173 and the fourth suction portions 174 are configured to be controllable individually, the third suction portions 173 and the fourth suction portions 174 need not necessarily be controllable individually. That is, the third suction portions 173 and the fourth suction portions 174 may be connected to a single vacuum pump.

In addition, in the above-described exemplary embodiment, the upper chuck 140 includes the first to fifth suction portions 171 to 175. However, the upper chuck 140 needs to be equipped with at least the first suction portions 171, and may not necessarily have the other suction portions 172 to 175.

By way of example, as shown in FIG. 21, an upper chuck 140A may be only equipped with the first suction portions 171 and the third suction portions 173. That is, it may include neither of the second suction portions 172, the fourth suction portions 174 and the fifth suction portion 175. Further, an upper chuck may be only equipped with the first suction portions 171, the second suction portions 172 and the fifth suction portion 175. Still further, an upper chuck may be only equipped with the first suction portions 171 and the second suction portions 172, or the first suction portions 171 and the fifth suction portion 175.

Moreover, though the above exemplary embodiment has been described for the case where the upper wafer W1 and the lower wafer W2 are single crystal silicon wafers, the kind of the substrates may not be limited to the single crystal silicon wafer. That is, the arrangement of the attraction regions of the upper chuck and the lower chuck may not be limited to the 45° directions and the 90° directions, but the attraction regions may be arranged according to the anisotropy of the physical property of the substrates held by the upper chuck and the lower chuck.

Further, though the above exemplary embodiment has been described for the case where the lower chuck 141 is equipped with the detachable protrusion part 260, the protrusion part 260 may not necessarily be detachable. For example, the protrusion part 260 may be implemented by a protrusion formed as one body with the pad unit 200.

Further, the inner attraction region 210 may be configured to be deformed between in a flat state without being protruded upwards and in a convex state where the inner attraction region 210 is protruded upwards with respect to the central portion thereof as a peak.

By way of example, as illustrated in FIG. 22, a lower chuck 141A includes an inner attraction region 210A and an outer attraction region 220A. The inner attraction region 210A includes a deformable stage 211 and a fixing ring 212. The deformable stage 211 has a substantially circular shape when viewed from the top, and a front surface side of the deformable stage 211, which holds the lower wafer W2 thereon, is of a planar shape in a non-deformation state where it is not deformed.

A peripheral portion of the deformable stage 211 is fixed to a base body 250A by the fixing ring 212 having a substantially annular shape. The base body 250A is fixed to the first lower chuck moving unit 160 (see FIG. 4).

The deformable stage 211 is configured to be convexly deformed. Here, the term "convex deformation" refers to a deformation in which a central portion of the deformable stage 211 is displaced to a higher position than a peripheral portion thereof and includes a case where the deformable stage 211 is upwardly curved toward the peripheral portion from the central portion thereof and becomes a part of a substantially spherical surface shape, as shown in FIG. 22.

A structure in which the deformable stage 211 is convexly deformed is not particularly limited. By way of non-limiting example, an air pressure may be used or a piezo actuator or the like may be used.

As an example, in case of using the piezo actuator, multiple piezo actuators are provided within the base body 250A. One of the multiple piezo actuators may be provided at a position corresponding to the central portion of the deformable stage 211, and the others may be equi-spaced on a single circle around the peripheral portion of the deformable stage 211.

Each piezo actuator is disposed with a top piece as a driving unit facing vertically upwards. Further, each piezo actuator has piezo elements stacked therein and moves each top piece up and down depending on a variation in voltages from non-illustrated voltage generators connected to each of the piezo elements. The deformable stage 211 is deformed according to a movement of each top piece.

As stated above, by using the piezo actuator, a deformation structure of the deformable stage 211 can be configured.

Further, the type of the actuator is not merely limited to the piezo actuator as long as the actuator is capable converting an input energy to a physical motion in a vertical direction.

Further, in the above-described exemplary embodiment, the first division region 230 of the lower chuck 141 is divided into the first outer division region 231 and the first inner division region 232, and the second division region 240 of the lower chuck 141 is divided into the second outer division region 241 and the second inner division region 242. However, the first division region 230 and the second division region 240 need not be necessarily divided. Furthermore, though the outer attraction region 220 is divided into the first division region 230 and the second division region 240 in the above-described exemplary embodiment, the outer attraction region 220 need not necessarily be divided.

From the foregoing, it will be appreciated that the exemplary embodiment of the present disclosure has been described herein for purposes of illustration, and that various modifications may be made without departing from the scope and spirit of the present disclosure. Accordingly, the embodiment disclosed herein is not intended to be limiting. The scope of the inventive concept is defined by the following claims and their equivalents rather than by the detailed description of the exemplary embodiment. It shall be understood that all modifications and embodiments conceived from the meaning and scope of the claims and their equivalents are included in the scope of the inventive concept.

The claims of the present application are different and possibly, at least in some aspects, broader in scope than the claims pursued in the parent application. To the extent any prior amendments or characterizations of the scope of any claim or cited document made during prosecution of the parent could be construed as a disclaimer of any subject matter supported by the present disclosure, Applicants hereby rescind and retract such disclaimer. Accordingly, the references previously presented in the parent applications may need to be revisited.

We claim:

1. A bonding apparatus, comprising:
   a first holding unit configured to attract and hold a first substrate from above;
   a second holding unit provided under the first holding unit and configured to attract and hold a second substrate from below; and
   a striker configured to press a central portion of the first substrate from above and bring the first substrate into contact with the second substrate,
   wherein the first holding unit is configured to attract and hold a partial region of a peripheral portion of the first substrate,
   when a bonding region between the first substrate and the second substrate has vertices of a shape closer to a polygonal shape that is expanded from a circular shape, the partial region includes a region intersecting with at least one direction from the central portion of the first substrate toward the vertices.

2. The bonding apparatus of claim 1,
   wherein the direction from the central portion toward the vertices is a direction in which the bonding region between the first substrate and the second substrate is expanded fastest.

3. The bonding apparatus of claim 1,
   wherein the first holding unit comprises:
   multiple first suction portions arranged in a first direction, among the directions from the central portion of the first substrate toward the peripheral portion thereof, in which the bonding region between the first substrate and the second substrate is expanded fastest; and
   multiple second suction portions arranged in a circumferential direction with the first suction portions therebetween and arranged in a second direction, among the directions from the central portion of the first substrate toward the peripheral portion thereof, in which the bonding region between the first substrate and the second substrate is expanded more slowly than in the first direction,
   wherein at least one of an attraction force and a timing for releasing the attraction of the first substrate is set to be different between the first suction portions and the second suction portions.

4. The bonding apparatus of claim 3,
   wherein each of the first substrate and the second substrate is a single crystal silicon wafer in which a crystal direction of a surface thereof is [100], and
   when a direction oriented toward a [0-11] crystal direction parallel to the surface of the first substrate from the central portion of the first substrate is defined as 0°, the multiple first suction portions are arranged at an interval of 90° with respect to a direction of 45°, and the multiple second suction portions are arranged at an interval of 90° with respect to a direction of 0°.

5. The bonding apparatus of claim 3,
   wherein the first holding unit comprises:
   multiple third suction portions arranged at an inner side than the multiple first suction portions in the first direction; and
   multiple fourth suction portions arranged at an inner side than the multiple second suction portions in the second direction.

6. The bonding apparatus of claim 5,
   wherein the first holding unit comprises:
   a fifth suction portion which has a circular ring shape and is arranged at an inner side than the multiple third suction portions and the multiple fourth suction portions.

7. A bonding apparatus, comprising:
   a first holding unit configured to attract and hold a first substrate from above;
   a second holding unit provided under the first holding unit and configured to attract and hold a second substrate from below; and
   a striker configured to press a central portion of the first substrate from above and bring the first substrate into contact with the second substrate,
   wherein a bonding region between the first substrate and the second substrate is classified into a first bonding region and a second bonding region expanded slower than the first bonding region, and
   the first holding unit is configured to attract and hold a first region of a peripheral portion of the first substrate corresponding to the first bonding region, and not to attract and hold a second region of a peripheral portion of the first substrate corresponding to the second bonding region.

8. A bonding system, comprising:
   a surface modifying apparatus configured to modify surfaces of a first substrate and a second substrate;
   a surface hydrophilizing apparatus configured to hydrophilize the modified surfaces of the first substrate and the second substrate; and a bonding apparatus configured to bond the first substrate and the second substrate, which are hydrophilized, by an intermolecular force, wherein the bonding apparatus comprises:

a first holding unit configured to attract and hold the first substrate from above;

a second holding unit provided under the first holding unit and configured to attract and hold the second substrate from below; and a striker configured to press a central portion of the first substrate from above and bring the first substrate into contact with the second substrate, wherein the first holding unit is configured to attract and hold a partial region of a peripheral portion of the first substrate, when a bonding region between the first substrate and the second substrate has vertices of a shape closer to a polygonal shape that is expanded from a circular shape, the partial region includes a region intersecting with at least one direction from the central portion of the first substrate toward the vertices.

9. The bonding system of claim 8, wherein the direction from the central portion toward the vertices is a direction in which the bonding region between the first substrate and the second substrate is expanded fastest.

* * * * *